(12) United States Patent
Smeys et al.

(10) Patent No.: US 7,902,661 B2
(45) Date of Patent: Mar. 8, 2011

(54) INTEGRATED CIRCUIT MICRO-MODULE

(75) Inventors: Peter Smeys, Mountain View, CA (US);
Peter Johnson, Sunnyvale, CA (US);
Peter Deane, Moss Beach, CA (US);
Reda R. Razouk, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 12/643,924

(22) Filed: Dec. 21, 2009

(65) Prior Publication Data

US 2010/0213603 A1   Aug. 26, 2010

Related U.S. Application Data

(63) Continuation-in-part of application No. 12/479,707, filed on Jun. 5, 2009, and a continuation-in-part of application No. 12/390,349, filed on Feb. 20, 2009.

(51) Int. Cl.
*H01L 23/04* (2006.01)
*H01L 23/12* (2006.01)
*H01L 23/053* (2006.01)
*H01L 23/23* (2006.01)

(52) U.S. Cl. ......... 257/698; 257/415; 257/678; 257/700; 257/713; 257/720; 257/E21.499; 257/E21.502; 257/E21.536; 257/E21.575

(58) Field of Classification Search ........... 257/E21.499, 257/E21.502, E21.506, E21.536, E21.575
See application file for complete search history.

(56) References Cited

U.S. PATENT DOCUMENTS

| | | | |
|---|---|---|---|
| 6,218,729 B1 | 4/2001 | Zavrel, Jr. et al. | |
| 6,555,759 B2 | 4/2003 | Tzanavaras et al. | |
| 6,734,569 B2 | 5/2004 | Appelt et al. | |
| 6,911,355 B2 | 6/2005 | Farnworth et al. | |
| 7,232,733 B2 | 6/2007 | Lotfi et al. | |
| 7,473,579 B2 | 1/2009 | Sharifi et al. | |
| 7,589,392 B2* | 9/2009 | Shastri et al. | 257/532 |
| 2003/0206680 A1 | 11/2003 | Bakir et al. | |
| 2004/0152242 A1 | 8/2004 | Wong | |
| 2007/0090533 A1* | 4/2007 | Haga et al. | 257/777 |
| 2007/0111385 A1 | 5/2007 | Magerlein et al. | |
| 2007/0132086 A1 | 6/2007 | Agraharam et al. | |
| 2007/0181979 A1* | 8/2007 | Beer et al. | 257/619 |
| 2007/0227761 A1 | 10/2007 | Tuominen et al. | |
| 2008/0079125 A1 | 4/2008 | Lu et al. | |
| 2008/0116564 A1 | 5/2008 | Yang et al. | |
| 2008/0157336 A1 | 7/2008 | Yang | |

(Continued)

OTHER PUBLICATIONS

Office Action dated Aug. 23, 2010 from U.S. Appl. No. 12/479,707.

(Continued)

*Primary Examiner* — Savitri Mulpuri
*Assistant Examiner* — Mohsen Ahmadi
(74) *Attorney, Agent, or Firm* — Beyer Law Group LLP

(57) ABSTRACT

Various apparatuses and methods for forming integrated circuit packages are described. One aspect of the invention pertains to an integrated circuit package in which one or more integrated circuits are embedded in a substrate and covered with a layer of photo-imageable epoxy. The substrate can be made of various materials, including silicon, quartz and glass. An integrated circuit is positioned within a cavity in the top surface of the substrate. The epoxy layer is formed over the top surface of the substrate and the active face of the integrated circuit. An interconnect layer is formed over the epoxy layer and is electrically coupled with the integrated circuit.

10 Claims, 17 Drawing Sheets

U.S. PATENT DOCUMENTS

| | | |
|---|---|---|
| 2008/0174020 A1 | 7/2008 | Ga |
| 2008/0201944 A1 | 8/2008 | Sakamoto et al. |
| 2009/0159875 A1* | 6/2009 | Chabinyc et al. ............... 257/40 |
| 2010/0013101 A1 | 1/2010 | Hedler et al. |
| 2010/0127375 A1 | 5/2010 | Galera et al. |

OTHER PUBLICATIONS

International Search Report dated Aug. 25, 2010 from International Patent Application No. PCT/US2010/020555.

Written Opinion dated Aug. 25, 2010 from International Patent Application No. PCT/US2010/020555.

Notice of Allowance dated Sep. 20, 2010 from U.S. Appl. No. 12/390,349.

Notice of Allowance dated Sep. 10, 2010 from U.S. Patent Appl. No. 12/479,713.

Tuominen, Risto. "IMB Technology for Embedding Active Components into a Substrate." SEMICON Europa, Munich, Germany. Apr. 4, 2006.

Keser et al. "Advanced Packaging: The Redistributed Chip Package." IEEE Transactions on Advanced Packaging, vol. 31, No. 1, Feb. 2008.

Knickerbocker et al. "3-D Silicon Integration Silicon Packaging Technology Using Silicon Through-Vias." IEEE Journal of Solid State Circuits, vol. 41, No. 8, Aug. 2006.

Sharifi et al. "Self-Aligned Wafer-Level Integration Technology with High-Density Interconnects Embedded Passives." IEEE Transactions on Advanced Packaging, vol. 30, No. 1, Feb. 2007.

JMD's Multi-Layer Organic (MLO) technology, downloaded Nov. 2007 from www.jacketmicro.com/technology/.

Yang et al. "3D Multilayer Integration and Packaging or Organic/Paper Low-cost Substrates for RF and Wireless Applications." IEEE 2007.

Pieters et al. "3D Wafer Level Packaging Approach Towards Cost Effective Low Loss High Density 3D Stacking." $7^{th}$ International Conference on Electronics Packaging Technology, 2006.

Tummala et al. "Microsystems Packaging from Milli to Microscale to Nanoscale." IEEE 2004.

Tummala, Rao R. "Packaging: Past, Present and Future." $6^{th}$ International Conference on Electronic Packaging Technology, 2005.

Lim, Sung Kyu. "Physical Design for 3D Systems on Package." IEEE Design & Test of Computers, 2005.

Yoon et al. "Polymer Embedded Module for SiP Application." 2004 Electronics Packaging Technology Conference.

Tummala, Rao R. "SOP: What Is It and Why? A New Microsystem-Integration Technology Paradigm—Moore's Law for System Integration of Miniaturized Convergent Systems of the Next Decade." IEEE Transactions on Advanced Packaging, vol. 27, No. 2, May 2004.

Souriau et al. "Wafer Level Processing of 3D System in Package for RF and Data Applications." 2005 Electronic Components and Technology Conference.

Adler, Micheal. "GE High Density Interconnect: A Solution to the System Interconnect Problem." Downloaded on Jul. 20, 2009 from IEEE Xplore.

Notice of Allowance dated Oct. 29, 2010 from U.S. Appl. No. 12/479,707.

Notice of Allowance dated Nov. 15, 2010 from U.S. Appl. No. 12/479,709.

Notice of Allowance dated Nov. 30, 2010 from U.S. Appl. No. 12/479,715.

* cited by examiner

INTEGRATED CIRCUIT MICRO-MODULE

CROSS-REFERENCE TO RELATED APPLICATIONS

This application is a Continuation-in-Part of and claims priority to U.S. patent application Ser. No. 12/479,707, entitled "Integrated Circuit Micro-Module," filed Jun. 5, 2009, and U.S. patent application Ser. No. 12/390,349, entitled "Integrated Circuit Micro-Module," filed Feb. 20, 2009, which are hereby incorporated by reference in their entirety for all purposes.

TECHNICAL FIELD

The present invention relates generally to the packaging of integrated circuits (ICs). More particularly, the present invention relates to integrated circuit micro-modules.

BACKGROUND OF THE INVENTION

There are a number of conventional processes for packaging integrated circuit (IC) dice. Some packaging techniques contemplate the creation of electronic modules that incorporate multiple electronic devices (e.g. integrated circuits, passive components such as inductors, capacitor, resisters or ferromagnetic materials, etc.) into a single package. Packages that incorporate more than one integrated circuit die are often referred to as multi-chip modules. Some multi-chip modules include a substrate or interposer that supports various components, while others utilize a lead frame, die or other structure to support various other package components.

A few multi-chip module packaging techniques have sought to integrate multiple interconnect layers into the package using, for example, laminated films or multiple stacked chip carriers. While existing arrangements and methods for packaging electronic modules work well, there are continuing efforts to develop improved packaging techniques that provide cost effective approaches for meeting the needs of a variety of different packaging applications.

SUMMARY OF THE INVENTION

One aspect of the invention pertains to an integrated circuit package in which one or more integrated circuits are embedded in a substrate and covered with a layer of photo-imageable epoxy. An integrated circuit is positioned within a cavity in the top surface of the substrate. The epoxy layer is formed over the top surface of the substrate and the active face of the integrated circuit. An interconnect layer is formed over the epoxy layer and is electrically coupled with the integrated circuit.

Additional integrated circuits, interconnect layers and/or epoxy layers can be stacked over the substrate as desired or appropriate for a particular application. The substrate and epoxy layers can include a wide variety of components, active and passive devices, such as sensors, inductors, capacitors, resistors, thermal pipes, photovoltaic cells, etc.

The substrate can have a wide variety of features, depending on the needs of a particular application. For example, the substrate can be a doped silicon wafer that is electrically grounded and electrically and thermally coupled with one or more embedded integrated circuits and/or contacts. In one embodiment the substrate is at least partly optically transparent and optical devices within the substrate can communicate through the substrate. Still another embodiment involves an integrated circuit in a cavity of the substrate that is separated from a sidewall of the cavity by an air gap. This arrangement can help reduce stresses on the integrated circuit when it expands due to a change in temperature.

Additional embodiments of the present invention pertain to methods for forming the aforementioned integrated circuit packages.

BRIEF DESCRIPTION OF THE DRAWINGS

The invention and the advantages thereof may best be understood by reference to the following description taken in conjunction with the accompanying drawings in which.

In the drawings, like reference numerals are sometimes used to designate like structural elements. It should also be appreciated that the depictions in the figures are diagrammatic and not to scale.

DETAILED DESCRIPTION OF EXAMPLE EMBODIMENTS

In one aspect, the present invention relates generally to integrated circuit (IC) packages and more specifically to IC micro-module technology. This aspect involves a micro-module made of multiple layers of a dielectric that is preferably photo-imageable and readily planarized. The micro-module may contain a variety of components including one or more integrated circuits, interconnect layers, heat sinks, conductive vias, passive devices, MEMS devices, sensors, thermal pipes etc. The various components can be arranged and stacked within the micro-module in a wide variety of different ways. The layers and components of the micro-module can be deposited and processed using various conventional wafer level processing techniques, such as spin coating, spray coating, lithography and/or electroplating. Another aspect of the present invention relates to wafer level manufacturing techniques and structures that integrate multiple active and/or passive components into a single, cost-effective, high-performance package.

Figure 1:
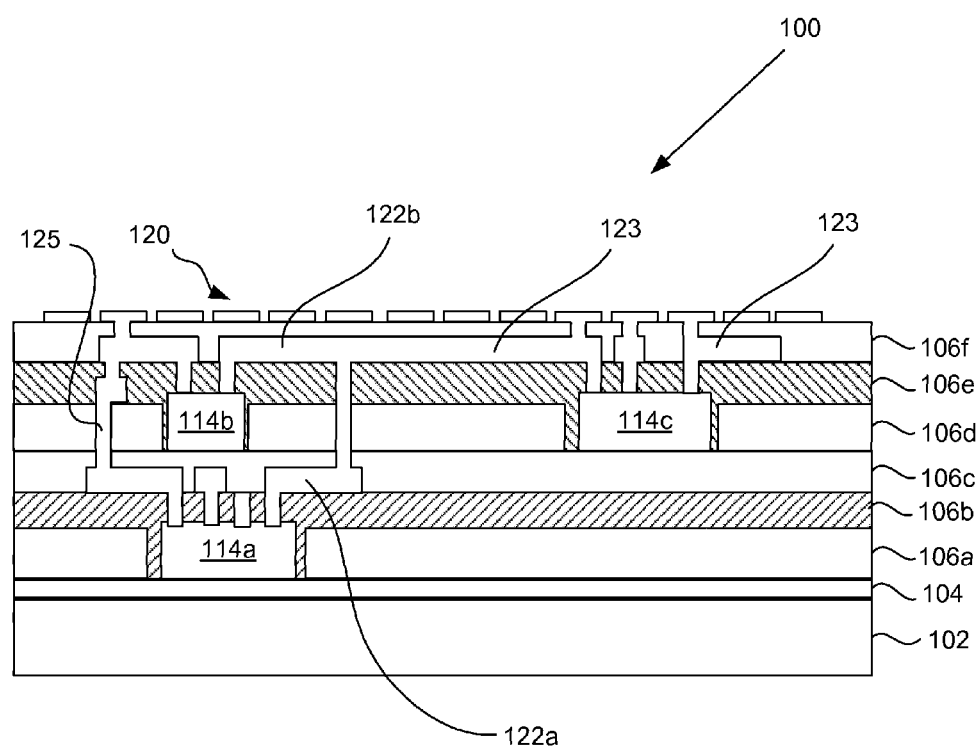
FIG. 1 illustrates a diagrammatic cross-sectional view of a package containing multiple integrated circuits and interconnect layers in accordance with an embodiment of the present invention

FIG. 1 illustrates a package according to one embodiment of the present invention. In the illustrated embodiment, a multi-tiered package 100 includes a substrate 102, a heat sink 104, a plurality of stacked dielectric layers 106, integrated circuits 114, passive components (not shown), interconnect layers 122, vias 125 and external contact pads 120. The heat sink 104 is formed over the substrate 102 and the dielectric layers 106 are stacked on top of the heat sink. Interconnect layers are interspersed as needed between adjacent dielectric layers 106. The integrated circuits are embedded within stacked layers of an dielectric 106, and may be electrically connected to other components (e.g., other ICs, passive components, external contact pads 120, etc. by appropriate traces in the interconnect layers 122 and vias 125. In the illustrated embodiment, one of the integrated circuits (114a) is effectively mounted on the heat sink 104 to provide good heat dissipation.

The dielectric layers 106 may be made from any suitable dielectric material. In various preferred embodiments, the dielectric layers 106 are made from a material that is readily planarized and/or photo-imageable. In a particular preferred embodiment, the layers are pmade from photo-imageable, planarizing SU-8, although other suitable materials may be used as well. In some designs the dielectric used for layers 106 is highly viscous when initially applied, and is subsequently partially or fully cured during a photolithographic process. The layers 106 may be applied using a variety of suitable techniques, including spin coating and spray coating. The thickness of the various dielectric layers can vary widely in accordance with the needs of a particular application and the different layers do not need to have the same thickness (although they may have the same thickness).

The integrated circuits 114 within package 100 can be arranged in a wide variety of ways and may be placed at almost any location within the package. By way of example, different integrated circuits 114 may be positioned in the substrate 102, different photo-imageable layers and/or within the same layer. In various embodiments, the integrated circuits 114 can be stacked, positioned side-by-side, placed in close proximity to one another and/or be separated by a substantial distance relative to the overall size of package 100. Integrated circuits positioned in different layers may be positioned directly or partially over one another or they may be separated such that they do not overlie one another. Integrated circuits 114 can also have a variety of different form factors, architectures and configurations. For example, they may take the form of relatively bare dice (e.g., unpackaged dice, flip chips etc.), partially and/or fully packaged dice (e.g., BGAs, LGAs, QFNs, etc.)

The electrical interconnects within the package 100 may be arranged in a wide variety of different ways as well. The embodiment illustrated in FIG. 1 includes two interconnect (trace) layers 122a and 122b. More or fewer interconnect layers are possible in different implementations. Each interconnect layer typically has at least one (but typically many) traces 123 that are used to help route electrical signals between different components of the package. The interconnect layers 122 are generally formed on top of an associated one of the planarized dielectric layers 106. The trace layer is then buried or covered by the next dielectric layer. Thus, the interconnect layers generally extend in planes that are parallel with and embedded within the dielectric layers.

Since the interconnect layers (and potentially other components of the package) are formed on top of a dielectric layer, it is desirable for the dielectric layers 106 to have a very flat and hard surface upon which other components (e.g. traces, passive components, etc.) may be formed or discrete components (e.g. ICs) may be mounted. SU-8 is particularly well suited for this application because it readily self-planarizes when applied using conventional spin-on and spray coating techniques and it is very hard when cured. Indeed, spun on SU-8 can be used to form a hard flat surface that does not require any additional planarizing (e.g., chemical mechanical polishing) before a high quality interconnect layer is formed thereon using conventional sputtering/electroplating techniques. Dielectric materials that can be applied in this manner to form a very flat surface are referred to herein as planarizing dielectrics.

Electrically conductive vias 125 are provided to electrically connect components (e.g., ICs/traces/contacts/passive components, etc.) that reside at different layers of the package. The vias 125 are arranged to extend through an associated dielectric layer 106. By way of example, the vias 125 may be used to couple traces from two different interconnect layers together; a die or another component to an interconnect layer; a contact to a trace, die or other component, etc. As will be described in more detail below, metalized vias may be formed at the same time that an associated interconnect layer 122 is deposited by filling via openings that were earlier formed in an associated dielectric layer 106.

Package 100 can include many other types of devices than the ones illustrated in FIG. 1. In the illustrated embodiment, only several integrated circuits and interconnect layers are shown. Package 100, however, can also contain almost any number of active and/or passive devices. Examples of such active and/or passive devices includes resistors, capacitors, magnetic cores, MEMS devices, sensors, cells (e.g., encapsulated lithium or others), integrated thin film battery structures, inductors, etc. These devices can be positioned and/or stacked in various locations within package 100. The components may take the form of prefabricated discrete components or may be formed in-situ. One advantage of the lithography-based process used to create package 100 is that these and other components can be formed in-situ during the layered formation of the package. That is, while prefabricated, discrete components can be placed in almost any position within package 100, components can also be fabricated directly onto any photo-imageable layer 106 using any suitable technique, such as conventional sputtering and/or electroplating. Due to the nature of this fabrication process, superior matching, precision and control can be achieved and low stress packaging is possible over various die and/or substrate sizes, including medium and large ones.

The substrate 102 may be made of any suitable material, including silicon, glass, steel, quartz, G10-FR4, any other FR4 family epoxy, etc. Depending on the needs of a particular application, the substrate can be electrically conductive, electrically insulating and/or optically transparent. In some embodiments, the substrate is used only as a carrier during fabrication and is accordingly removed before the package is completed. In other embodiments, the substrate remains an integral part of the package. If desired, the substrate 102 may be thinned after assembly by backgrinding or other suitable techniques. In still other embodiments, the substrate may be omitted entirely.

In some embodiments, the substrate 102 can integrate one or more sensors (not shown.) This approach enables the integration of sensor components without the packaging and reliability concerns often associated with the sensor's requirements to be exposed to the environment. Sensors can be mounted on either side of the substrate 102 and can be embedded or exposed to the environment through etched windows or micro-channels. Examples of suitable sensors include but are not limited to biosensors, sensors for gas, chemical, electromagnetic, acceleration, vibration, temperature, humidity etc.

One approach is to integrate a sensing element into the backside of the substrate 102. The sensing element can be built inside a deep cavity in the substrate 102 that has been etched from the backside of the substrate 102. For example the sensing element may be a capacitor made from electroplated Cu fingers. The capacitor can be connected with contact pads on the frontside of the substrate 102 through microvias. Package 100 can be formed over these contact pads such that the capacitor is electrically coupled with at least some of the electrical devices and interconnect layers within package 100. The sensing element inside the cavity that is created on the backside of the wafer can be filled with the gas sensitive material and can be automatically exposed to the environment, while the active circuitry on the frontside of substrate 102 can be protected by conventional encapsulation techniques, such as those discussed below in connection with FIG. 5E.

Package 100 also includes a system for dissipating internally generated heat, which can include thermal pipes and heat sinks, such as heat sink 104. Such a system can play an important role in the performance of the package 100, because packages with high power densities and multiple embedded devices may need to have good heat dissipation to function properly. The thermal pipes and heat sinks are generally formed at substantially the same time and using the same techniques as the interconnect layers 122. Such thermal pipes can penetrate and/or wind through one or more interconnect layers and/or photo-imageable layers. Any single, continuous thermal pipe, trace and/or via can branch off into multiple other traces and/or vias at almost any point and can extend in more than one direction, such as laterally and/or vertically within the package. The thermal pipes can thermally couple virtually any device within the package 100 with one or more heat dissipation pads and/or heat sinks located on the exterior of the package 100.

The heat sink 104 can have a variety of different architectures. In the illustrated embodiment heat sink 104 forms a layer having a footprint that substantially matches the footprint of the photo-imageable layers of package 100. Alternatively, the package 100 could include one or more heat sinks whose dimensions at least partly match those of an overlying or underlying active device, such as an integrated circuit. In the illustrated embodiment, the heat sink takes the form of a layer or sheet 104 formed over the substrate and forms a base for the dielectric layers 106. If desired, integrated circuits 104 can be mounted directly on the heat sink layer as illustrated by integrated circuit 114(*a*). Alternatively, thermally conductive vias (not shown) may be used to improve the thermal path between a buried integrated circuit and the heat sink as illustrated by integrated circuit 114(*b*). In some embodiments, the heat sink(s) or heat sink layer(s) are exposed on a top or bottom surface of the package. In others, a substrate or other layer may cover the heat sink(s) or heat sink layers such that the heat sinks function as heat spreaders. The heat sink(s) 104 may be made of a variety of suitable conductive materials, such as copper and may be formed in the same manner as the interconnect layers.

Various embodiments of the package 100 can incorporate a variety of other features as well. For example, package 100 can incorporate high voltage (HV) isolation and an embedded inductive galvanic capability. It can feature wireless interfaces e.g., RF antennas for wireless system IO, EM power scavenging, RF shielding for EMI sensitive application, etc. In various embodiments, package 100 can include power management subsystems e.g., superchargers, integrated photovoltaic switches etc. The package 100 could be formed on a wafer and encapsulated e.g., as shown in FIG. 5E. Sensing surfaces and materials can be integrated into other processing steps for the package 100 and the wafer e.g., as discussed above and in connection with FIGS. 5A-5H, 6A-6C and 7A-7C.

Figure 2:
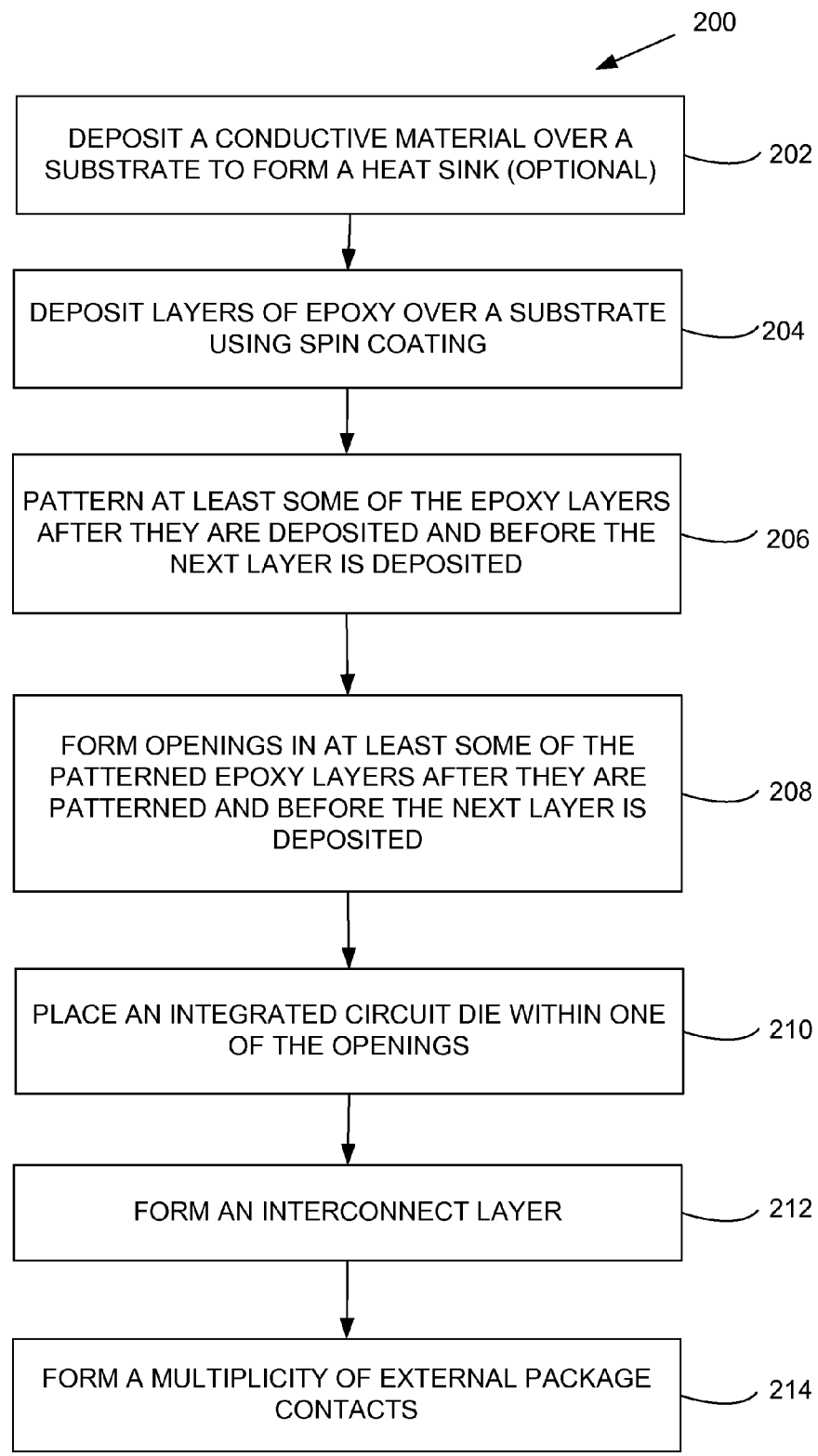
FIG. 2 is a process flow diagram illustrating a wafer level process for packaging integrated circuits in accordance with an embodiment of the present invention.

Referring next to FIG. 2, a wafer level method 200 for forming integrated circuit package 100 according to an embodiment of the present invention will be described. The steps of method 200 are illustrated in FIGS. 3A-3L. The steps of method 200 may be repeated and/or performed out of the illustrated order. It should be noted that the process depicted in method 200 may be used to concurrently form many structures other than those shown in FIGS. 3A-3L.

Figure 3A:
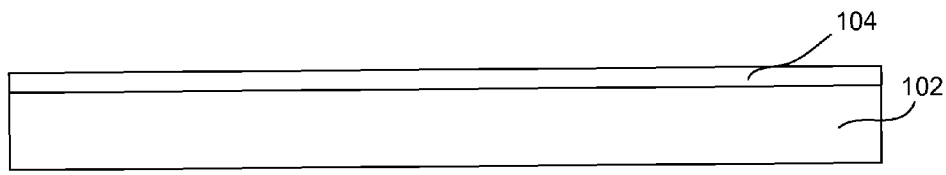
FIGS. 3A-3L illustrate diagrammatic cross-sectional views of selected steps in the process of FIG. 2.

Initially, in step 202 of FIG. 2, an optional conductive layer 104 of FIG. 3A is formed over a substrate 102 using any of a variety of suitable techniques. By way of example, sputtering of a seed layer followed by conventional electroplating works well. Of course other suitable conductive layer formation techniques may be used as well. The conductive layer 104 functions as a heat sink and may be made of various materials, such as copper or other appropriate metals or metal layer stacks. The substrate 102 may be a wafer and can be made of a variety of suitable materials, such as silicon, G10-FR4, steel, glass, plastic, etc.

Figure 3B:
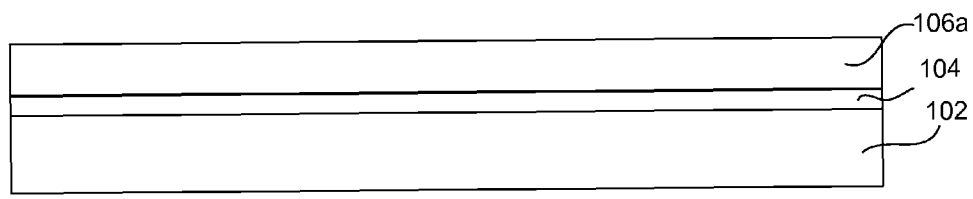

In FIG. 3B, a layer of planarizing, photo-imageable epoxy 106*a* is deposited over the heat sink 104 (step 204 of FIG. 2). This can be done using a variety of techniques, such as spin coating, spray coating or sheet lamination. In the illustrated embodiment, the epoxy layer 106*a* is SU-8, although other appropriate dielectric materials may be used. SU-8 is well suited for applications using conventional spin-on coating techniques.

SU-8 has various advantageous properties. It is a highly viscous, photo-imageable, chemically inert polymer that can solidify when exposed to UV radiation, for example, during a photolithographic process. SU-8 provides greater mechanical strength relative to some other known photoresists, is resistant to overpolishing and is mechanically and thermally stable at temperatures up to at least 300° C. It planarizes easily and evenly using spin coating relative to certain other photo-imageable materials such as BCB, which allows it to be readily used as a base upon which interconnects or passive components may be fabricated, and upon which integrated circuits or other passive components may be mounted. It can readily be used to create dielectric layers with thicknesses in the range of 1 um to 250 um and both thinner and thicker layers are possible. In particular embodiments, openings can be formed in SU-8 having high aspect ratios (e.g. approximately 5:1 or greater) which facilitates the formation of components such as conductive vias or other structures with high aspect ratios. By way of example, aspect ratios of 7:1 are readily obtainable. Relative to many other materials, superior control, precision and matching can be achieved with SU-8 layers, which can result in higher densities and improved performance. Other suitable dielectric materials with one or more of the above characteristics may also be used in place of SU-8.

In step 206 of FIG. 2, epoxy layer 106*a* is patterned using conventional photolithographic techniques. In one embodiment, a mask is used to selectively expose portions of the epoxy layer 106*a*. The exposure can be followed by a baking operation. These operations can cause the exposed portions of the epoxy layer 106*a* to crosslink. During the photolithographic process, exposed portions of epoxy layer 106a may be cured, partially cured (e.g., B-staged) or otherwise altered or hardened relative to the unexposed portions to facilitate later removal of unexposed portions of the epoxy.

Figure 3C:
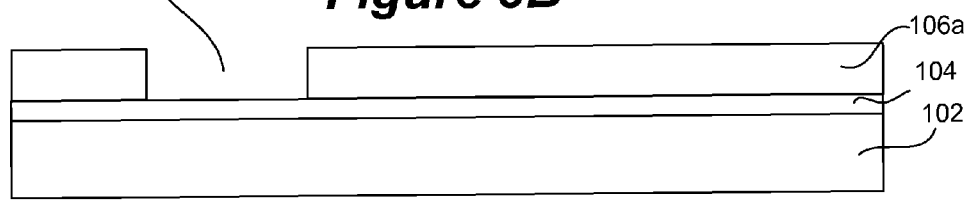

In step 208 of FIG. 2 and FIG. 3C, unexposed portions of the epoxy layer 106a are removed to form one or more openings 306 in the epoxy layer 106a. This removal process can be performed in a variety of ways. For example, the epoxy layer 106a can be developed in a developer solution, resulting in the dissolution of the unexposed portions of the layer 106a. A hard bake can be performed after the developing operation.

Figure 3D:
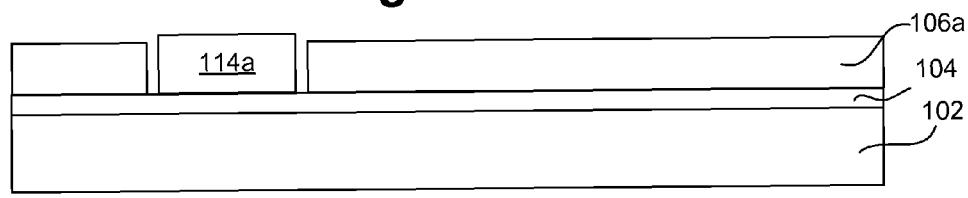

In step 210 of FIG. 2 and FIG. 3D, an integrated circuit 114a is placed in opening 306 and mounted on the heat sink 104. The integrated circuit 114a may be configured in a variety of ways. For example, the integrated circuit 114a may be a bare or flip chip die, or it could have a BGA, LGA and/or other suitable pinout configuration. In the illustrated embodiment, the thickness of the integrated circuit 114a is greater than the thickness of the epoxy layer 106a in which it is initially embedded, although in other embodiments, the die may be substantially the same thickness, or thinner than the epoxy layer in which it is initially embedded. The active face of the integrated circuit 114a may face up or down. In particular embodiments, the integrated circuit 114a may be attached and thermally coupled to heat sink 104 using an adhesive.

Figure 3E:
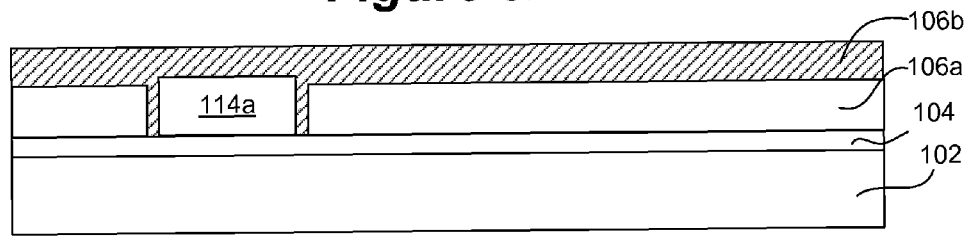

After the integrated circuit 114a has been positioned in opening 306 and attached to the heat sink, a second layer of epoxy 106b is applied over the integrated circuit 114a and the epoxy layer 106a (step 204 of FIG. 2) as illustrated in FIG. 3E. Like the first epoxy layer 106a, the second epoxy layer 106b may be deposited using any suitable method, such as spin coating. In the illustrated embodiment, epoxy layer 106b is directly over, immediately adjacent to and/or in direct contact with integrated circuit 114a and epoxy layer 106a, although other arrangements are possible. The epoxy layer 106b may completely or partially cover the active surface of integrated circuit 114a.

Figure 3F:
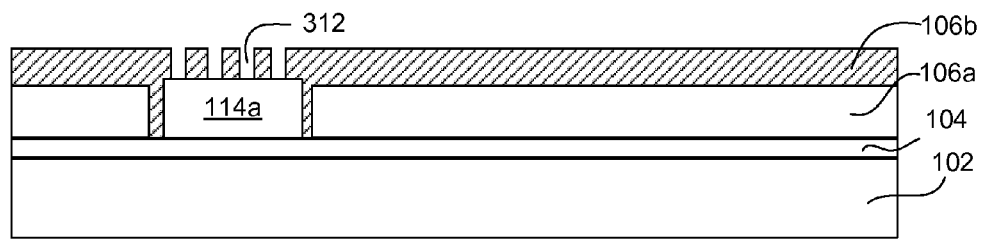

After epoxy layer 106b has been applied, it is patterned and developed using any suitable techniques (steps 206 and 208), which would typically be the same techniques used to pattern the first epoxy layer 106a. In the illustrated embodiment, via openings 312 are formed over integrated circuit 114a to expose I/O bond pads (not shown) on the active surface of integrated circuit 114a. The resulting structure is illustrated in FIG. 3F.

Figure 3G:
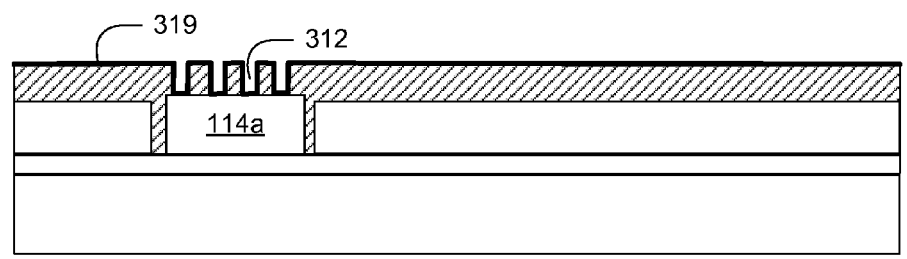

After any appropriate via openings 312 have been formed, a seed layer 319 is deposited over openings 312 and epoxy layer 106b, as shown in FIG. 3G. The seed layer 319 can be made of various suitable materials, including a stack of sequentially applied sublayers (e.g., Ti, Cu and Ti,) and can be be deposited using a variety of processes (e.g., by sputtering a thin metal layer on the exposed surfaces.) A feature of the described approach is that the sputtered seed layer tends to coat all exposed surfaces including the sidewalls and bottoms of via openings 312. The deposition of seed layer 319 can also be limited to just a portion of the exposed surfaces.

Figure 3H:
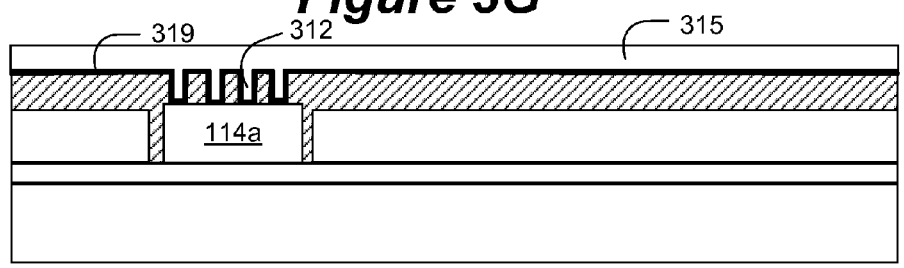
Figure 3I:
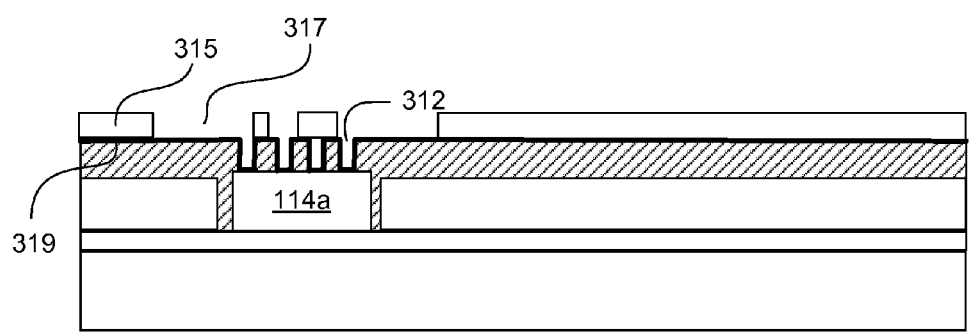

In FIG. 3H, a photoresist 315 is applied over the seed layer 319. The photoresist 315, which can be positive or negative, covers seed layer 319 and fills openings 312. In FIG. 3I, the photoresist is patterned and developed to form open regions 317 that expose the seed layer 319. The open areas are patterned to reflect the desired layout of the interconnect layer, including any desired conductive traces and heat pipes, and any vias desired in the underlying epoxy layer 106(b). After the desired open areas have been formed, the exposed portions of the seed layer are then electroplated to form the desired interconnect layer structures. In some embodiments, a portion of the seed layer (e.g., Ti) is etched prior to electroplating. During electroplating, a voltage is applied to seed layer 319 to facilitate the electroplating of a conductive material, such as copper, into the open regions 317. After the interconnect layer has been formed, the photoresist 315 and the seed layer 319 in the field is then stripped.

Figure 3J:
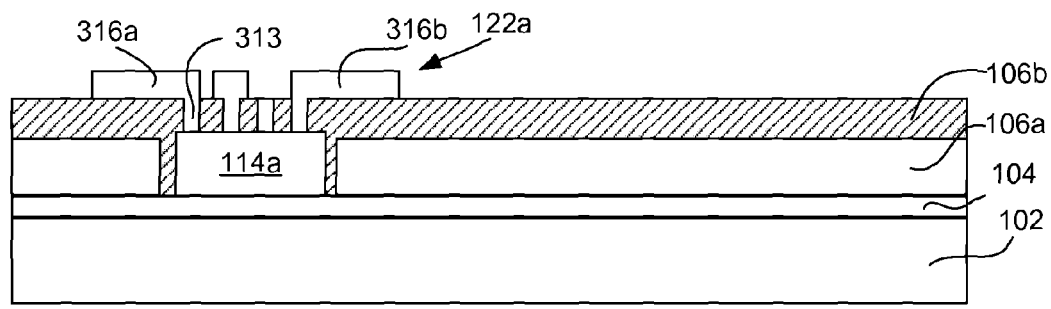

As a result, interconnect layer 122a is formed over the epoxy layer 106b, as illustrated in FIG. 3J (step 212). The aforementioned electroplating served to fill the via opening with metal thereby forming metal vias 313 in the spaces formerly defined by the via openings. The metal vias 313 may be arranged to electrically couple the I/O pads of the integrated circuit 114a with corresponding traces 316 of interconnect layer 122a. Because seed layer 319 has been deposited on both the sidewalls and bottoms of openings 312, the conductive material accumulates substantially concurrently on the sidewalls and the bottoms, resulting in the faster filling of openings 312 than if the seed layer were coated only on the bottom of openings 312.

Although not shown in epoxy layers 106a and 106b, other vias can also be formed all the way through one or more epoxy layers to couple components (e.g. traces, passive devices, external contact pads, ICs, etc. together). In still other arrangements conductive vias may be formed between a surface of a bottom (or other) surface of an integrated circuit and the heat sink layer 104 to provide a good thermal conduction path to the heat sink even when the metallization is not used for its current carrying capabilities. In general, interconnect layer 122a can have any number of associated traces and metal vias and these conductors can be routed in any manner appropriate for electrically coupling their associated package components.

It is noted that a particular sputtering/electro-deposition process has been described that is well suited for forming traces over and vias within an associated epoxy layer 106 at substantially the same time. However, it should be appreciated that a variety of other conventional or newly developed processes may be used to form the vias and traces either separately or together.

Figure 3K:
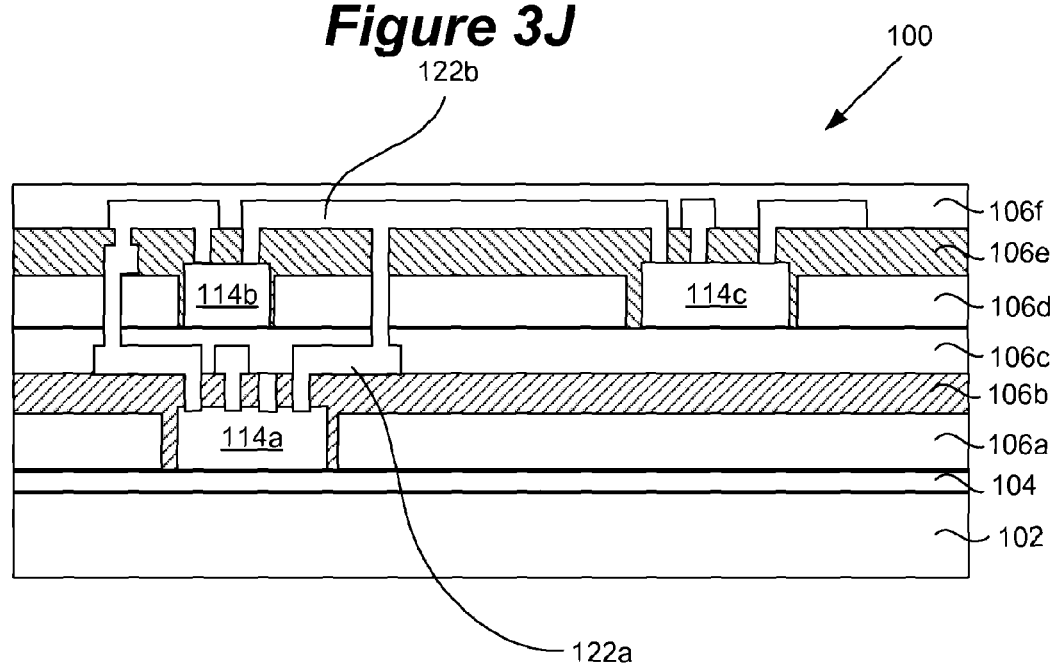

After the interconnect layer 122a has been formed, steps 204, 206, 208, 210 and/or 212 can generally be repeated in any order that is appropriate to form additional epoxy layers, interconnect layers, and to place or form appropriate components therein or thereon to form a particular package 100 such as the package illustrated in FIG. 3K. By way of example, in the illustrated embodiment additional epoxy layers 106c-106f are applied over layer 106b (effectively by repeating step 204 as appropriate). Integrated circuits 114b and 114c are embedded within epoxy layers 106d and 106e (steps 206, 208 and 210). Another interconnect layer 122b is formed within top epoxy layer 106f (steps 206, 208 and 212) and so on.

It should be appreciated that integrated circuits and interconnect layers in package 100 may be arranged in a variety of ways, depending on the needs of a particular application. For example, in the illustrated embodiment, the active faces of some integrated circuits are stacked directly over one another (e.g., integrated circuits 114a and 114b). Some integrated circuits are embedded within the same epoxy layer or layers (e.g., integrated circuits 114b and 114c.) Integrated circuits may be embedded in epoxy layers that are distinct from epoxy layers in which interconnect layers are embedded (e.g., interconnect layer 318a and electrical circuits 114a and 114b). ("Distinct" epoxy layers means layers where each layer is deposited in a single, cohesive coat in a sequence with the other layers, as is the case with epoxy layers 106a-106e.) Integrated circuits may be stacked over and/or situated in close proximity to one another. Integrated circuits may also be electrically coupled via electrical interconnect layers, vias and/or traces that extend substantially beyond the immediate vicinity or profile of any single integrated circuit (e.g., integrated circuits 114b and 114c).

Figure 3L:
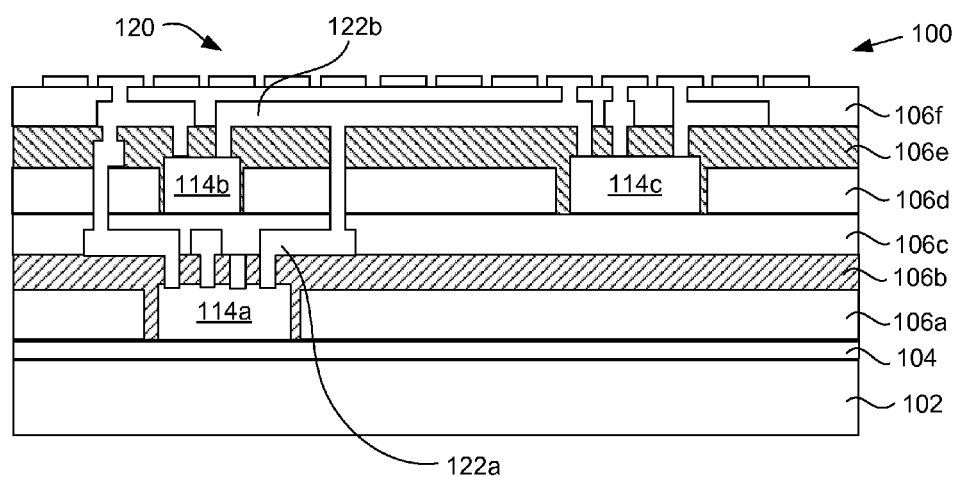

In step 214 of FIG. 2 and FIG. 3L, optional external contact pads 120 can be added to a top surface of package 100. The external contact pads 120 may be placed on other surfaces and formed in a variety of ways. For example, top epoxy layer 106f may be patterned and developed using the techniques described above to expose portions of electrical interconnect layer 122b. Any suitable metal, such as copper, may be electroplated into the holes on epoxy layer 106f to form conductive vias and external contact pads 120. As a result, at least some of the external contact pads 120 can be electrically coupled with electrical interconnect layers 122a-122b and/or integrated circuits 114a-114c.

The features of package 100 may be modified in a variety of ways. For example, it could contain more or fewer integrated circuits and/or interconnect layers. It could also contain multiple additional components, such as sensors, MEMS devices, resistors, capacitors, thin film battery structures, photovoltaic cells, RF wireless antennas and/or inductors. In some embodiments, substrate 102 is background away or otherwise discarded. Substrate 102 may have any suitable thickness. By way of example, thicknesses in the range of approximately 100 to 250 um work well for many applications. The thickness of the package 100 may vary widely. By way of example, thicknesses in the range of 0.5 to 1 mm work well in many applications. The thickness of electrical interconnect layers 122a and 122b may also widely vary with the needs of a particular application. By way of example, thicknesses of approximately 50 microns are believed to work well in many applications.

Figure 4A:
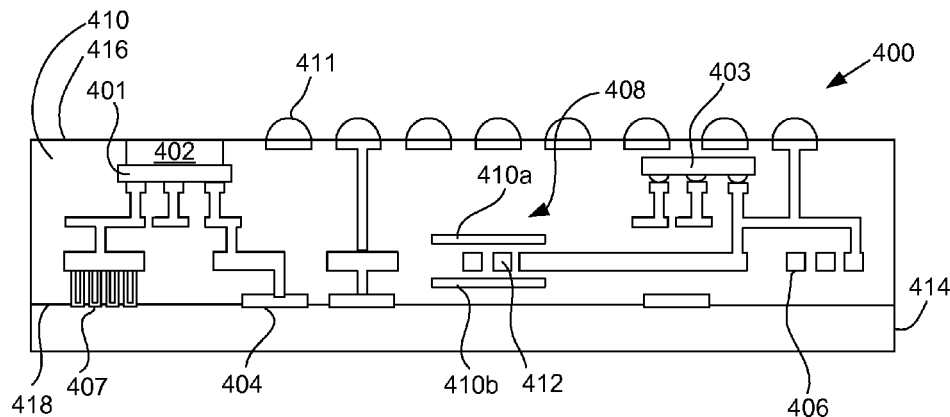
FIGS. 4A-4E illustrate diagrammatic cross-sectional views of packages in accordance with various alternative embodiments of the present invention.

FIG. 4A is a cross-sectional view of another embodiment of the present invention. Similar to package 100 of FIG. 1, package 400 of FIG. 4A includes integrated circuits 401 and 403, epoxy layers 410 and multiple interconnect layers. Package 400 also includes some additional optional features that are not shown in package 100.

For example, package 400 features an integrated circuit 401 that is thermally coupled with a heat sink 402. In the illustrated embodiment, some of the dimensions of heat sink 402 are substantially similar to those of the thermally coupled device. In particular embodiments, heat sink 402 may be larger or smaller than its underlying device. Heat sink 402 may be positioned on and/or be in direct contact with a top or bottom surface of the integrated circuit 401. It may have direct access to an external surface of package 400 (as is the case in the illustrated embodiment), or be connected to the external surface via one or more thermal vias. Heat sink 402 can be thermally coupled with a conductive layer, such as layer 104 of FIG. 1. In a preferred embodiment in which the epoxy layers 410 are made of SU-8, having a heat sink 402 directly below integrated circuit 401 can be particularly helpful, since heat does not conduct well through SU-8.

Package 400 also features various passive components, such as inductors 406 and 408, resistor 404 and capacitor 407. These passive components may be situated in any epoxy layer or location within package 400. They may be formed using a variety of suitable techniques, depending on the needs of a particular application. For example, inductor windings 412 and inductor cores 410a and 410b can be formed by depositing conductive material and ferromagnetic material, respectively, over at least one of the epoxy layers 410. Thin-film resistors may be formed by sputtering or applying any suitable resistive material, such as silicon chromium, nickel chromium and/or silicon carbide chrome, over one of the epoxy layers 410. Capacitors can be formed by sandwiching a thin dielectric layer between metal plates deposited over one or more epoxy layers. Prefabricated resistors, inductors and capacitors may be placed on one or more epoxy layers 410 as well. Conductive, ferromagnetic and other materials can be deposited using any suitable method known in the art, such as electroplating or sputtering.

Package 400 also includes optional BGA-type contact pads 411 on frontside surface 416. Because of the location of the contact pads 410, substrate 414 can be made of various materials, such as G10-FR4, steel or glass. In particular embodiments where the contact pads are on the backside surface 418, the substrate 414 can be made of silicon and feature through vias that enable electrical connections with the contact pads. In another embodiment, the substrate is primarily used as a building platform to form the package 400 and is ultimately ground off.

Figure 4B:
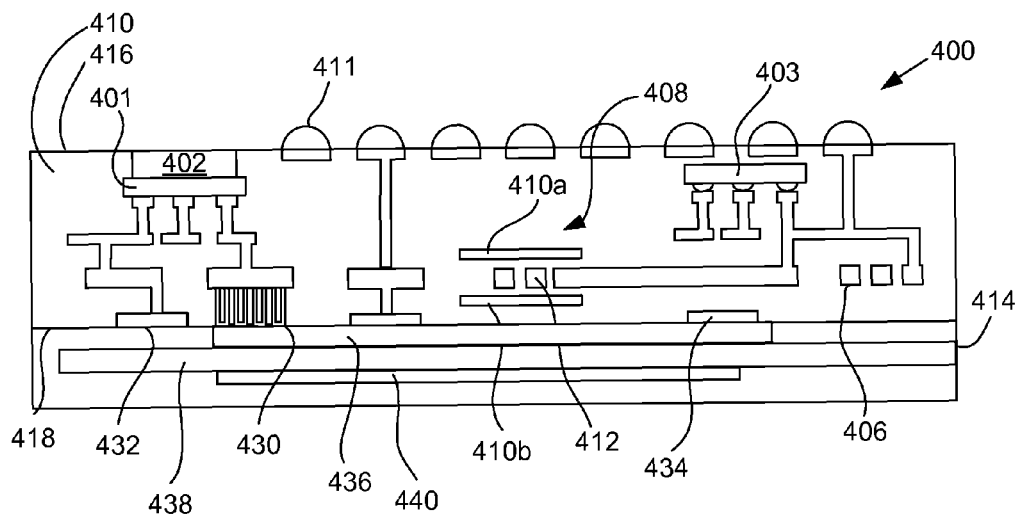

FIG. 4B illustrates another embodiment of the present invention, which has many of the features illustrated in FIG. 4A. This embodiment includes additional components, including precision trim-able capacitor 430 and resistor 432, micro-relay 434, low cost configurable, precision passive feedback network 436, FR-4 mount 438, and photovoltaic cell 440. Cell 440 could be covered with a layer of transparent material, such as transparent SU-8. In other embodiments, photovoltaic cell 440 could be replaced by a windowed gas sensor, a wireless phased antenna array, a heat sink or another suitable component. Package 400 can include many additional structures, including a power inductor array, a RF capable antenna, thermal pipes and external pads for dissipating heat from the interior of the package 100.

Figure 4C:
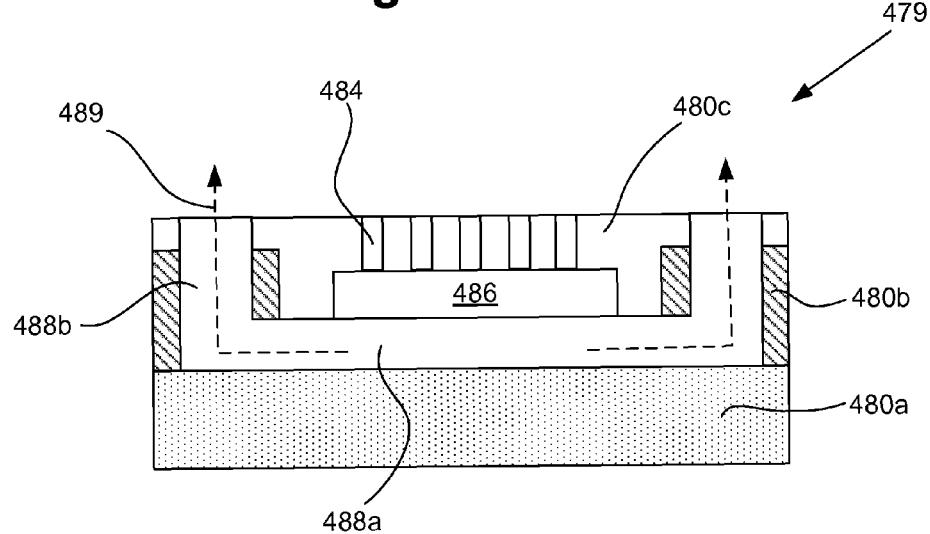
Figure 4D:
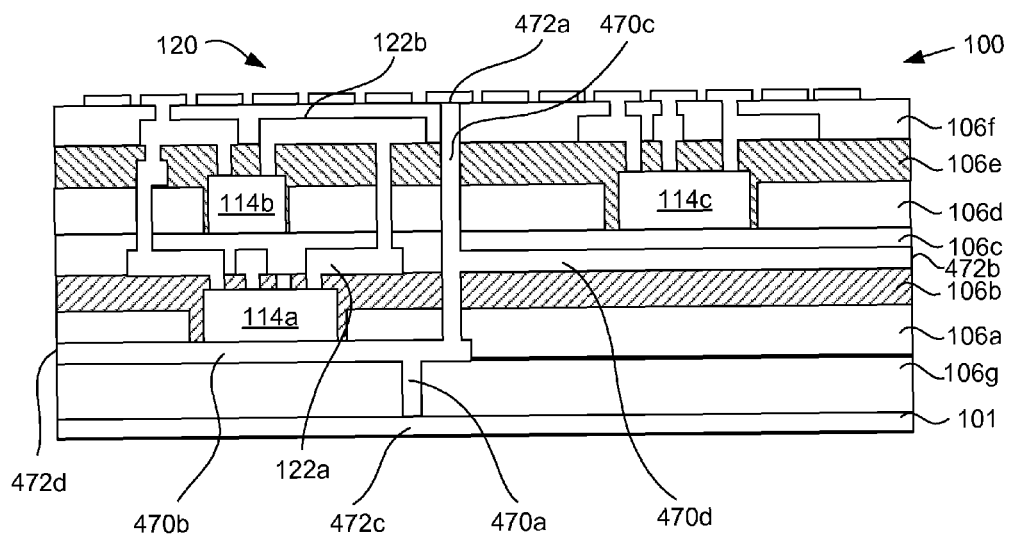

FIGS. 4C and 4D illustrate two other embodiments having thermal pipes. FIG. 4B illustrates a package 479 that includes an integrated circuit 486 embedded in multiple layers of planarizing, photo-imageable epoxy 480. Metal interconnects 484 are coupled with bond pads (not shown) on the active surface of the integrated circuit 486. The backside of the integrated circuit 486 is mounted onto a thermal pipe 488, which includes thermal trace 488a and thermal vias 488b. Thermal pipe 488 is made of any suitable material that conducts heat well, such as copper. As indicated by the dotted line 489, heat from the integrated circuit 486 is routed through the backside of the integrated circuit 486, around thermal trace 488a and up through thermal vias 488b, so that the heat is ventilated through the external top surface of the package 479. The embodiment illustrated in FIG. 4B can be fabricated using various techniques, such as the ones discussed in connection with FIGS. 3A-3K.

FIG. 4D illustrates another embodiment of the present invention. The embodiment includes an intergrated circuit 114a whose bottom surface is thermally coupled with thermal pipes 470. Thermal pipes 470 are made from a thermally conductive material, such as copper, and transmit heat from the intergrated circuit 114a to external heat ventilation sites 472 of package 100. Heat dissipation can pose a problem for packages with multiple integrated devices and high power densities. Thermal pipes 470, which can be coupled with one or more devices within package 100, allow internally generated heat to be transported to one or more external surfaces of package 100. In FIG. 4C, for example, heat is conducted away from the intergrated circuit 114a to heat ventilation sites 472 on the top, bottom and multiple side surfaces of package 100, although heat ventilation sites can be located on almost any location on the exterior of the package 100.

Heat sinks can also be mounted on the top, bottom, side and/or almost any external surface of the package 100. In the illustrated embodiment, for example, heat spreader 101, which is on the bottom surface of package 100, is thermally coupled with thermal pipes 470 and dissipates heat over the entire bottom surface area of package 100. In one embodiment, all of the thermal pipes in the package 100, which are thermally coupled with multiple embedded integrated circuits, are also coupled with heat spreader 101. In a variation on this embodiment, some of the thermal pipes are also coupled with a heat sink located on the top surface of the package 100. Thermal pipes 470 can be formed using processes similar to those used to fabricate interconnect layers 122. They can be coupled with multiple passive and/or active devices within package 100 and can extend in almost any direction within package 100. In the illustrated embodiment, for example, thermal pipes 470 extend both parallel and perpendicular to some of the planes formed by the photo-imageable layers 106. As shown in FIG. 4C, thermal pipes 470 can include thermal traces 470b and 470d and/or vias 470a and 470c that penetrate one or more interconnect layers 122 and/or photo-imageable layers 106. The thermal pipes 470 can be configured to dissipate heat, conduct electrical signals, or both. In one embodiment, an interconnect layer for transmitting electrical signals and a thermal pipe that is not suitable for transmitting electrical signals are embedded within the same epoxy layer.

Figure 4E:
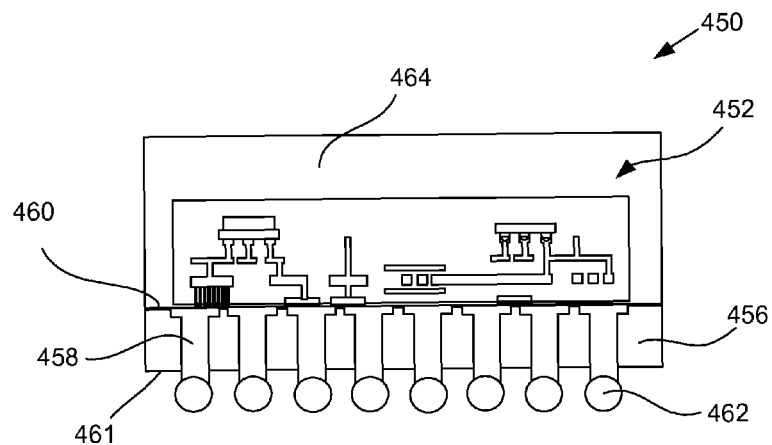

Another embodiment of the present invention is illustrated in FIG. 4E. Package arrangement 450 includes a microsystem 452 formed on the top surface 460 of substrate 456. Microsystem 452 may include multiple dielectric layers, interconnect layers, active and/or passive components and can have any of the features described in connection with package 100 of FIG. 1 and/or package 400 of FIG. 4A. Microsystem 452 and top surface 460 of substrate 465 are encapsulated in molding material 464, which may be made of any suitable material, such as a thermosetting plastic. Multiple metallic vias 458 electrically couple external pads (not shown) on the bottom of microsystem 452 with the bottom surface 461 of substrate 456. The vias 458 terminate at optional solder balls 462, which can be made from various conductive materials. Solder balls 462 may be mounted on, for example, a printed circuit board to enable electrical connections between microsystem 452 and various external components.

Figure 5A:
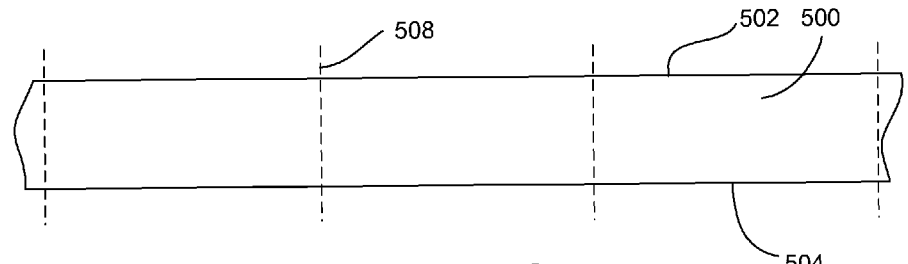
FIGS. 5A-5H illustrate selected steps in a wafer level process for packaging integrated circuits in accordance with another embodiment of the present invention.
Figure 5B:
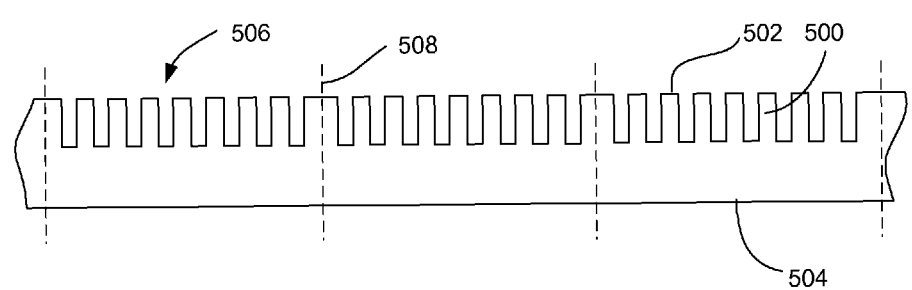
Figure 5C:
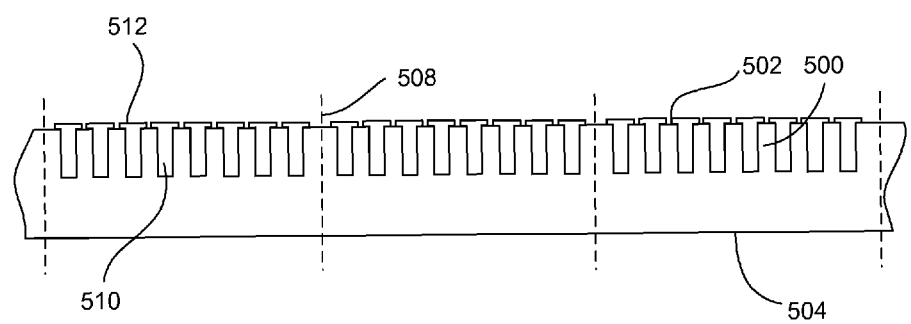
Figure 5D:
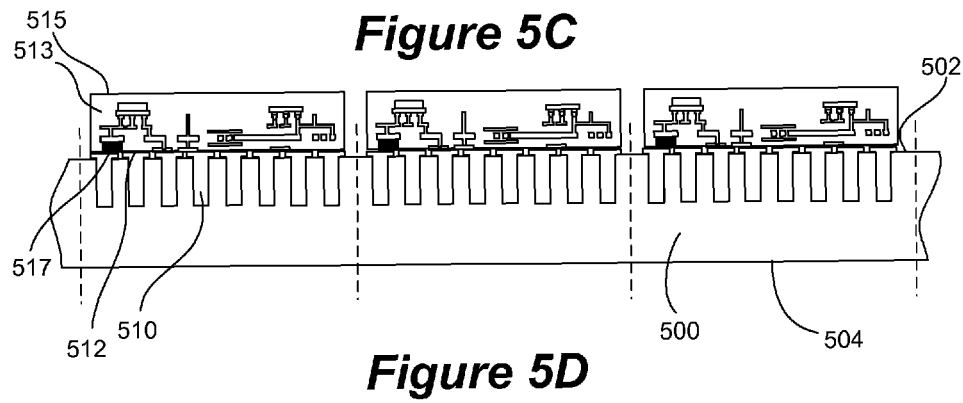
Figure 5E:
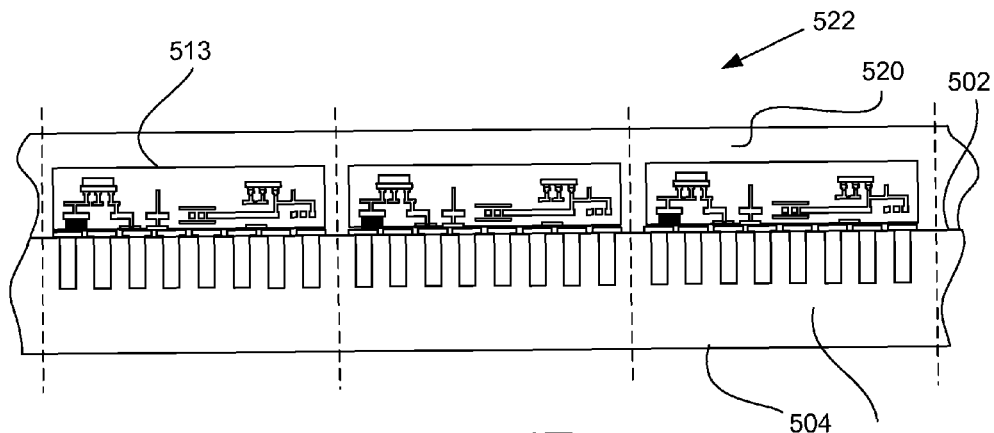

FIGS. 5A-5J illustrate cross-sectional views of a wafer level process for building a package similar to arrangement 450 of FIG. 4D. FIG. 5A depicts a wafer 500 with a top surface 502 and a bottom surface 504. Only a small portion of wafer 500 is shown. The dotted vertical lines indicate projected scribe lines 508. In the illustrated embodiment, substrate 500 can be made of a variety of suitable materials, such as silicon.

In FIG. 5B, the top surface 502 of wafer 500 is etched to form holes 506. This etching process may be performed using a variety of techniques, such as plasma etching. Afterwards, metal is deposited into the holes to form an electrical system. This deposition may be performed using any suitable method, such as electroplating. For example, a seed layer (not shown) may be deposited over top surface 502 of wafer 500. The seed layer may then be electroplated with a metal such as copper. The electroplating process can produce metal vias 510 and contact pads 512 on the top surface 502 of wafer 500.

In FIG. 5D, microsystems 513 are formed on the top surface 502 of wafer 500 using steps similar to those described in connection with FIGS. 2 and 3A-3L. In the illustrated embodiment, microsystems 513 do not have external contact pads formed on their top surfaces 515, as the top surfaces 515 will be overmolded in a later operation. In another embodiment, external contact pads are formed on top surfaces 515 to enable wafer level functional testing prior to overmolding. Microsystems 513 have external contact regions on their bottom surfaces 517, which are aligned with the contact pads 512 on the top surface 502 of wafer 500. This facilitates an electrical connection between the metal vias 510 and the interconnect layers within the microsystems 513.

In FIG. 5E, a suitable molding material 520 is applied over the microsystems 513 and the top surface 502 of the wafer 500. The molding process can be performed using a variety of suitable techniques and materials. As a result, a molded wafer structure 522 is formed. In some designs, the molding material 520 completely covers and encapsulates microsystems 513 and/or the entire top surface 502. The application of molding material 520 may provide additional mechanical support for microsystems 513, which may be useful when microsystems 513 are large.

Figure 5F:
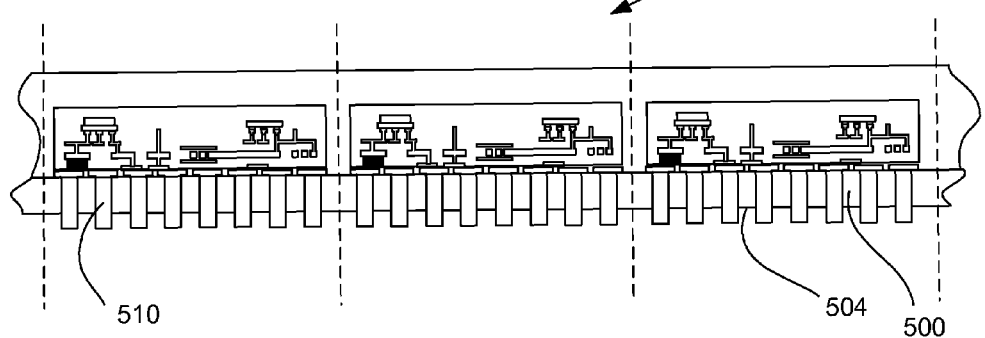
Figure 5G:
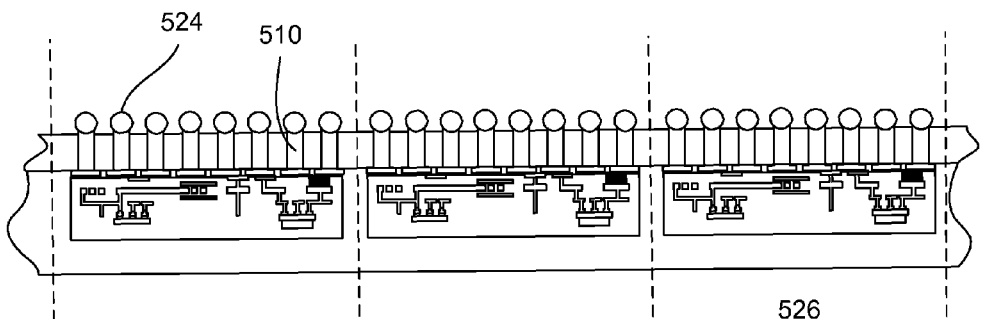
Figure 5H:
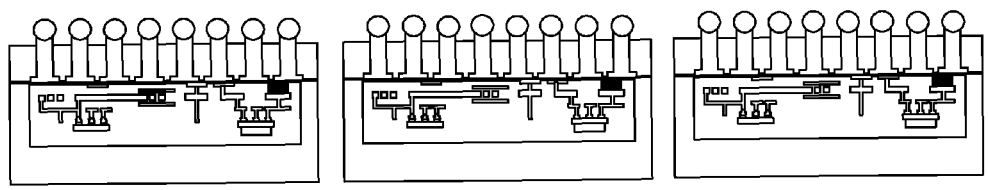

FIG. 5F depicts molded wafer structure 522 after the bottom surface 504 of wafer 500 has been partially removed using any of a range of suitable techniques, such as backgrinding. As a result, portions of metal vias 510 are exposed. In FIG. 5G, solder balls 524 are applied to the exposed portions of metal vias 510. In FIG. 5H, the molded wafer structure 522 is then singulated along projected scribe lines 508 to create individual package arrangements 526. The singulation process can be performed using a variety of appropriate methods, such as sawing or laser cutting.

Figure 6A:
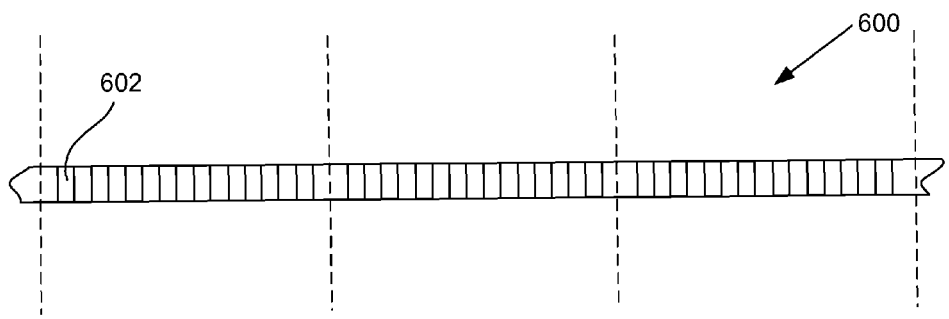
FIGS. 6A-6C illustrate selected steps in a wafer level process for packaging integrated circuits in accordance with another embodiment of the present invention.
Figure 6B:
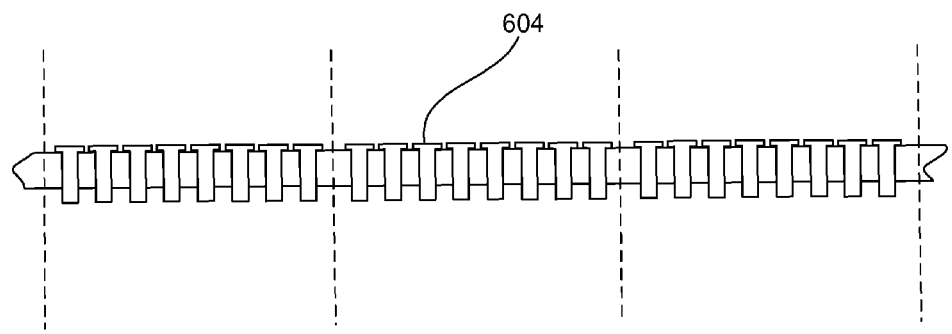
Figure 6C:
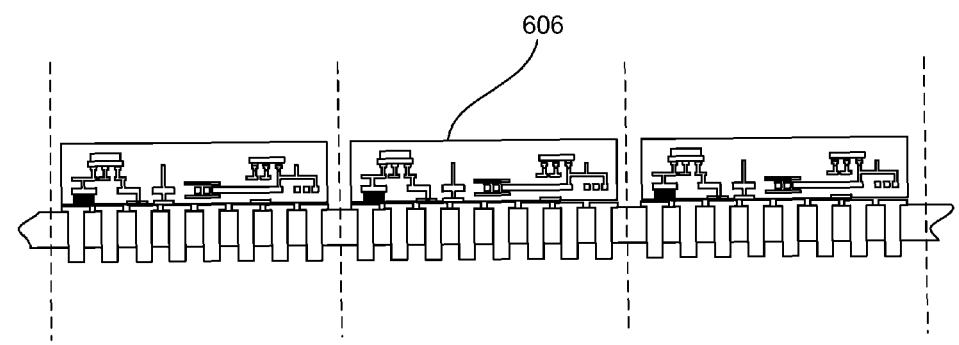

FIGS. 6A-6C illustrate cross-sectional views of a wafer level process for building a package according to another embodiment of the present invention. FIG. 6A shows a substrate 600 prefabricated with through holes 602. FIG. 6B illustrates the deposition of metal into the holes 602 to form metal vias 604. The deposition of metal can be performed using any suitable technique, such as electroplating. In some embodiments, the substrate 600 comes prefabricated with through holes 602 and/or metal vias 604, thus eliminating one or more processing steps. In FIG. 6C, microsystems 606 are formed over the metal vias 604 and the substrate 600 using any of the aforementioned techniques. Afterward, solder bumping and singulation can be performed, as shown in FIGS. 5G and 5H. The illustrated embodiment can include various features like those described in connection with FIGS. 5A-5H.

Figure 7A:
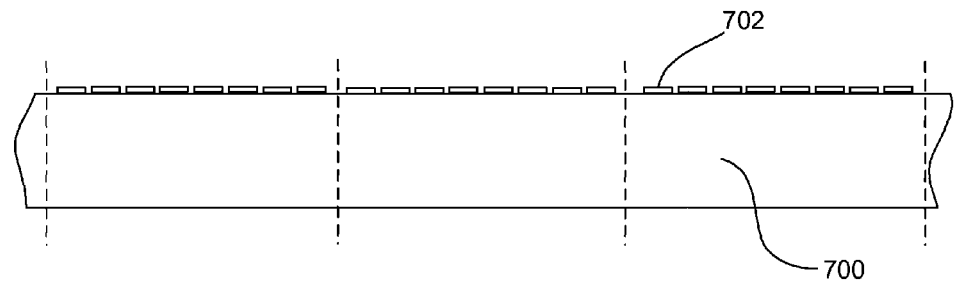
FIG. 7A-7C illustrate selected steps in a wafer level process for packaging integrated circuits in accordance with yet another embodiment of the present invention.
Figure 7B:
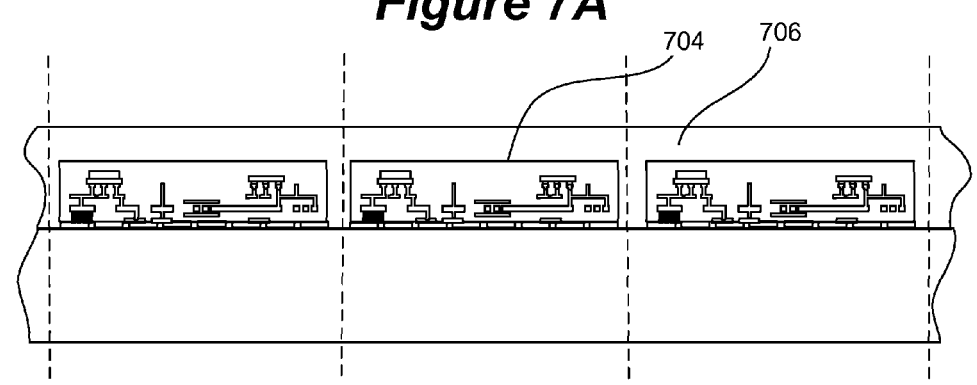
Figure 7C:
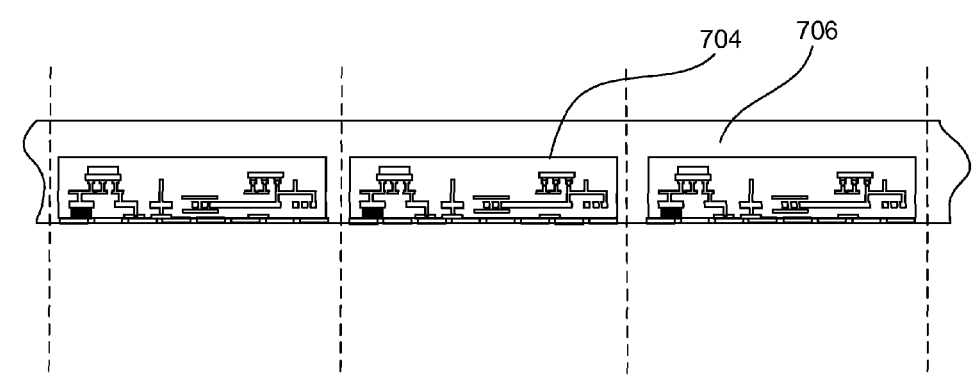

FIGS. 7A-7C illustrate cross-sectional views of a wafer level process for building a package according to another embodiment of the present invention. Initially, a substrate 700 is provided. Copper pads 702 are then formed over the top surface of the substrate 700. In FIG. 7B, microsystems 704 are formed over copper pads 702 and substrate 700 using any of the aforementioned techniques. The microsystems 704 and the top surface of the substrate 700 are then encapsulated in a suitable molding material 706. The substrate 700 is then entirely ground away or otherwise removed in FIG. 7C. Afterward, solder bumps can be attached to copper pads 702. The illustrated embodiment can include various features like those described in connection with FIGS. 5A-5H.

Additional embodiments of the present invention are illustrated in FIGS. 8-10. These embodiments pertain to integrated circuit packages in which one or more integrated circuits is embedded within a substrate e.g., a silicon substrate. The embedded integrated circuit is covered with a photo-imageable epoxy layer. An interconnect layer is formed over the epoxy layer and is electrically coupled with the integrated circuit through one or more vias in the epoxy layer.

Embedding one or more integrated circuits in the substrate can offer various advantages. For example, various embodiments of the present invention involve embedded integrated circuits that can use the substrate as a thermal heat sink, an electrically conductor, and/or a medium for optical communication. When a silicon wafer is used as the substrate, the similarity in the coefficients of thermal expansion of an embedded integrated circuit and a silicon substrate can help reduce the risk of delamination. In some implementations the embedding of an integrated circuit in the substrate instead of the epoxy layer can help minimize the thickness of the epoxy layer and reduce the size of the package.

Figure 8A:
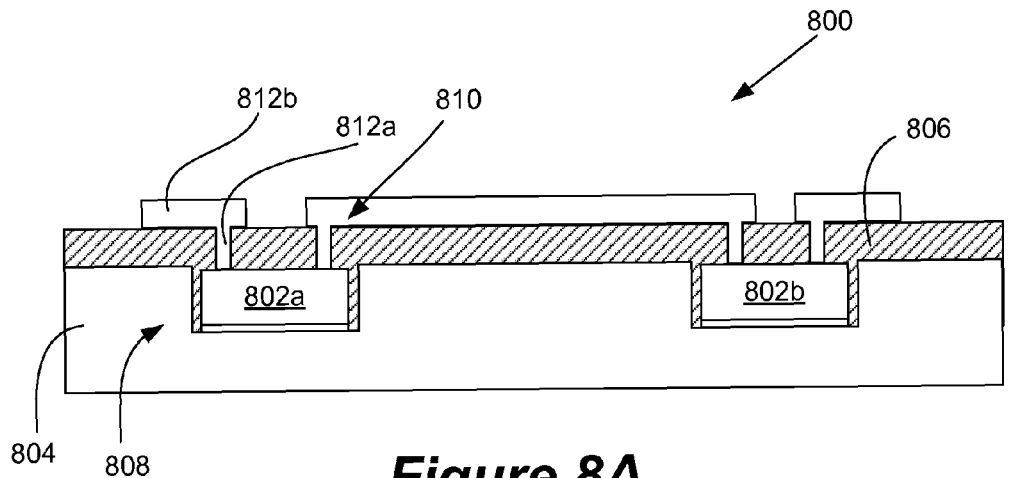
FIGS. 8A-8B illustrate diagrammatic cross-sectional views of packages that each include a substrate with embedded integrated circuits according to various embodiments of the present invention.
Figure 8B:
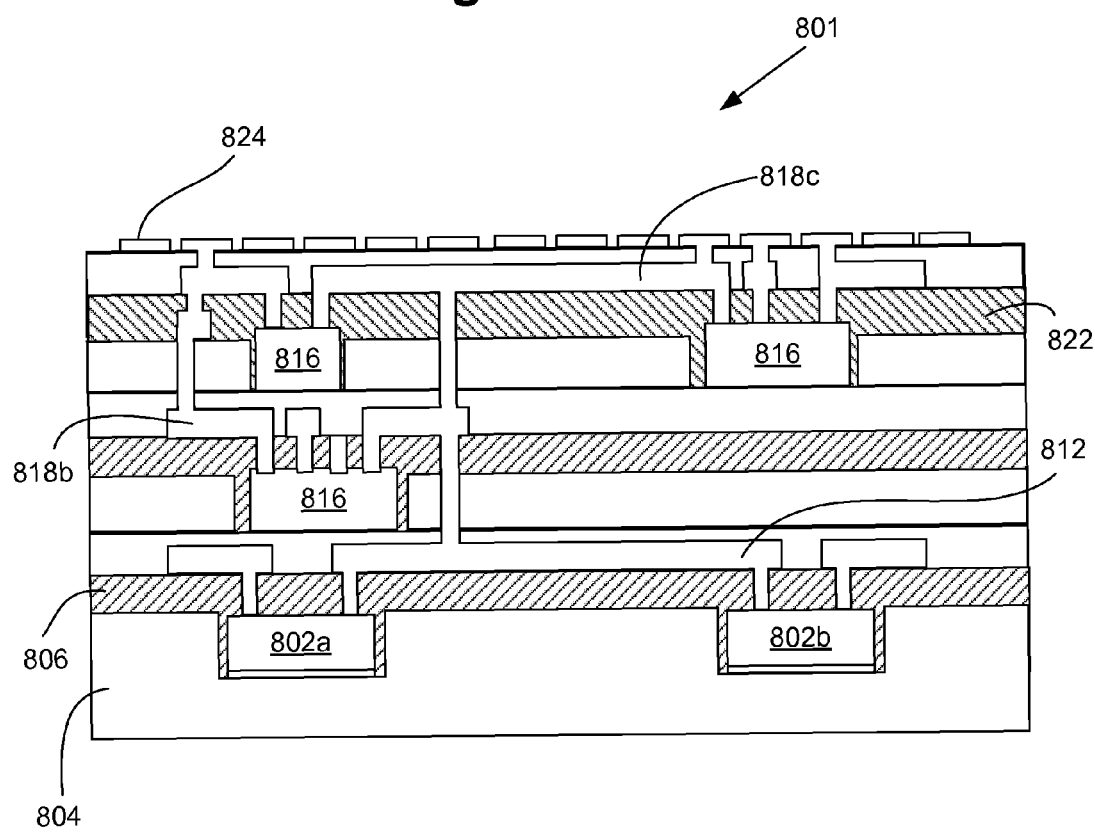

Referring now to FIGS. 8A and 8B, various examples of integrated circuit packages that include substrates with one or more embedded integrated circuits are described. FIG. 8A illustrates an integrated circuit package 800, which includes a substrate 804, integrated circuits 802, a layer of epoxy 806 and an interconnect layer 812. The substrate 804 is preferably a silicon wafer, which is easily handled by existing semiconductor packaging equipment. Depending on the intended use of the package 800, however, other suitable materials (e.g., glass, quartz, etc.) can be used. Integrated circuits 802 are positioned within cavities 808 in a top surface of the substrate 804. The active face of the integrated circuits 802 and the top surface of the substrate 804 are covered with a layer of epoxy 806. The epoxy layer 806 is made of a planarizing, photo-imageable, epoxy such as SU-8. The interconnect layer 812 is formed over the epoxy layer 806. The interconnect layer 812 includes conductive traces 812b and conductive vias 812a, which extend into openings 810 in the epoxy layer 806 and are electrically coupled with I/O pads on the active faces of the integrated circuits 802. In various implementations where the addition of more epoxy layers, integrated circuits and electrical components are not contemplated, a dielectric layer can be applied over the interconnect layer 812. Bonding pads can be formed on the outside of the package 800 that are electrically coupled with the integrated circuits 802 and the interconnect layer 812 through openings in the dielectric layer.

FIG. 8B illustrates another embodiment of the present invention that involves positioning additional epoxy layers, integrated circuits and interconnect layers over the substrate 804. The integrated circuit package 801 includes multiple, adjacent layers of epoxy 822, interconnect layers 818 and integrated circuits 816 that are stacked over the interconnect layer 812, epoxy layer 806, integrated circuits 802 and substrate 804. Integrated circuits 816 are each positioned in at least one of the epoxy layers 822. Interconnect layers 818 are interspersed between various integrated circuits 816 and epoxy layers 822. The interconnect layers 818 electrically connect various integrated circuits 802 and 816 with one another and with I/O pads 824 that are formed on the top surface of the integrated circuit package 801.

It should be appreciated the FIGS. 8A and 8B represent particular embodiments from which many variations are possible. For example, there can be one or almost any number of integrated circuits positioned within or on the substrate 804. The positioning of the conductive vias and traces, the placement and dimensions of the cavities and/or the thickness of the interconnect layers and epoxy layers can differ from what is shown in the figures. Additionally, any of the features and arrangements described in connection with FIGS. 1 through 7C can be combined with or be used to modify almost any aspect of FIGS. 8A and 8B.

Figure 9A:
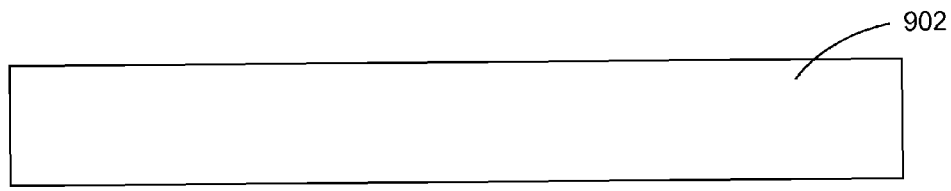
FIGS. 9A-9G illustrate selected steps in a wafer level process for forming packages that each include a substrate with embedded integrated circuits according to another embodiment of the present invention.

Referring to FIGS. 9A-9G, an exemplary method of forming the integrated circuit packages of FIGS. 8A and 8B is described. In FIG. 9A, a substrate 902 is provided. In a preferred embodiment, the substrate 902 is a silicon wafer, as this can help maximize the compatibility of the operations of FIGS. 9A-9F with existing semiconductor wafer-based processing equipment. In alternative embodiments, substrate 902 can be made from a wide variety of materials, including silicon, glass, steel, G10-FR4, quartz, etc., depending on the needs of a particular application.

Figure 9B:
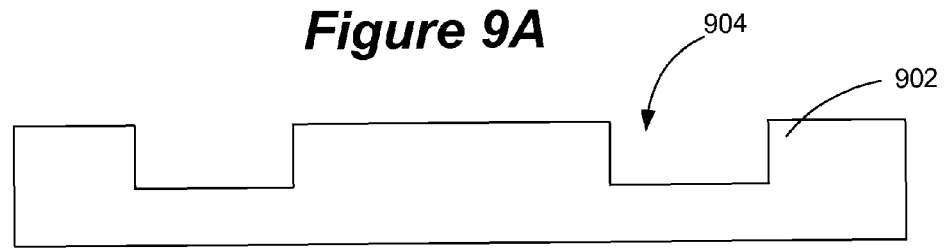
Figure 9C:
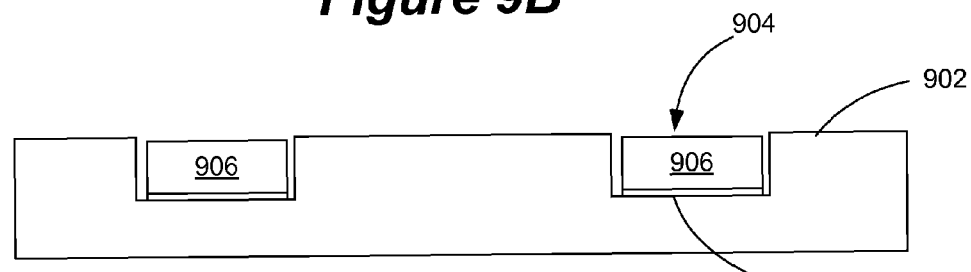

In FIG. 9B, cavities 904 are formed in the substrate 902. Cavities 904 can be formed using wet or plasma etching, although other suitable techniques can be used as well. The chemistries used in the etching process and the crystalline structure of the silicon in the substrate 902 can help control the angle of the sidewalls for cavity 904. For example, it has been found that a silicon crystal structure of [1,1,0] can help produce a straighter sidewall and/or help form a sidewall that is approximately perpendicular to the bottom surface of its corresponding cavity. A die attach adhesive 903 can be applied to the bottom of the cavity 904 to help adhere the integrated circuit 906 to the bottom surface of the cavity 904, as shown in FIG. 9C. In an alternative embodiment, the die attach adhesive 903 is applied to a back surface of the integrated circuit 906, either individually or on the wafer level, prior to the placement of the integrated circuit 906 in the cavity 904. Depending on the needs of a particular application, the die attach adhesive can be electrically conductive or non-conductive. In some embodiments, both types of adhesive are used in the same package such that one integrated circuit is electrically coupled through its bottom surface with an electrically conductive substrate and another integrated circuit is electrically insulated from the substrate. (Various applications for an electrically conductive substrate are discussed below.)

Figure 9D:
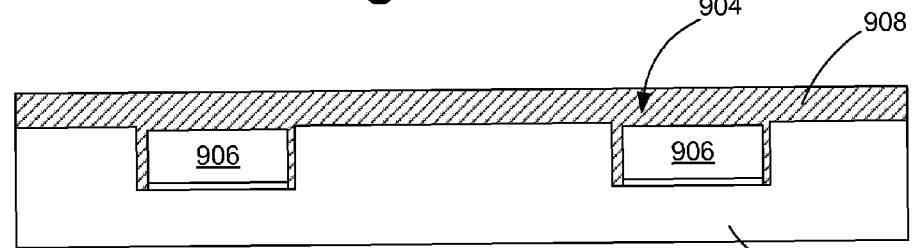

In FIG. 9D, a layer of planarizing, photo-imageable epoxy 908 is deposited over the cavities 904, the substrate 902 and the integrated circuits 906. The epoxy layer 908 is preferably SU-8, but other suitable materials can also be used. The epoxy layer can extend over and come in direct contact with the active surface of the integrated circuit 906 and can fill in the cavity 904 in the substrate 902. As noted earlier, one of the advantages of using a photo-imageable epoxy such as SU-8 is the degree of control that can be exercised over it using photolithographic techniques.

Figure 9E:
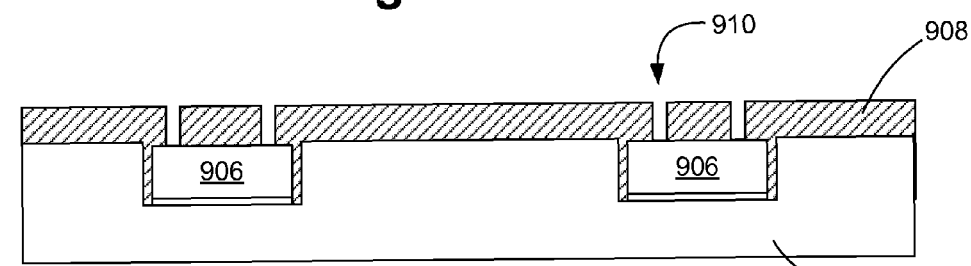

In FIG. 9E, one or more openings 910 are formed in the epoxy layer 908. The openings 910 can be created in a wide variety of ways known to persons of ordinary skill in the field of semiconductor processing. For example, the epoxy layer 908 can be photolithographically patterned and portions of the epoxy layer 908 can be dissolved using a developer solution. The openings 910 can expose I/O pads on the active surfaces of the integrated circuits 906 embedded within the epoxy layer 908.

Figure 9F:
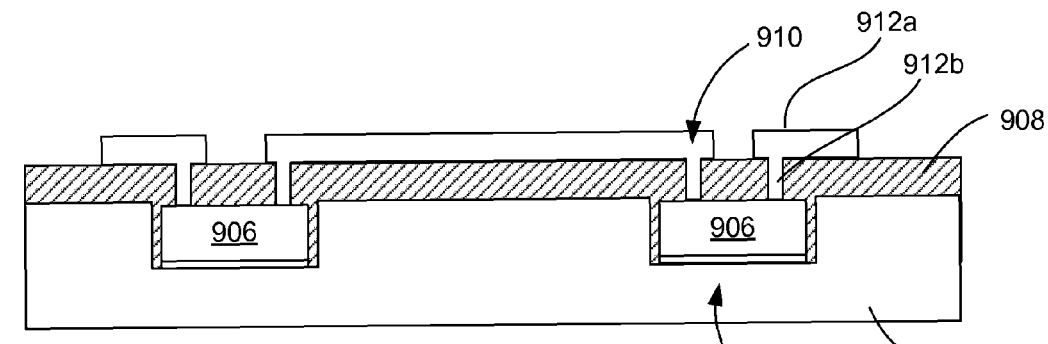

FIG. 9F illustrates the formation of an interconnect layer 912, which can be performed using various suitable techniques that are known in the art. One approach, which can resemble the steps described in connection with FIGS. 3F-3J, involves depositing a seed layer and a photoresist layer, patterning the photoresist and electroplating a metal to form conductive traces 912a and conductive vias 912b in the openings 910. In various embodiments, the interconnect layer 912 electrically connects multiple integrated circuit dice 906 that are embedded in the substrate 902.

Figure 9G:
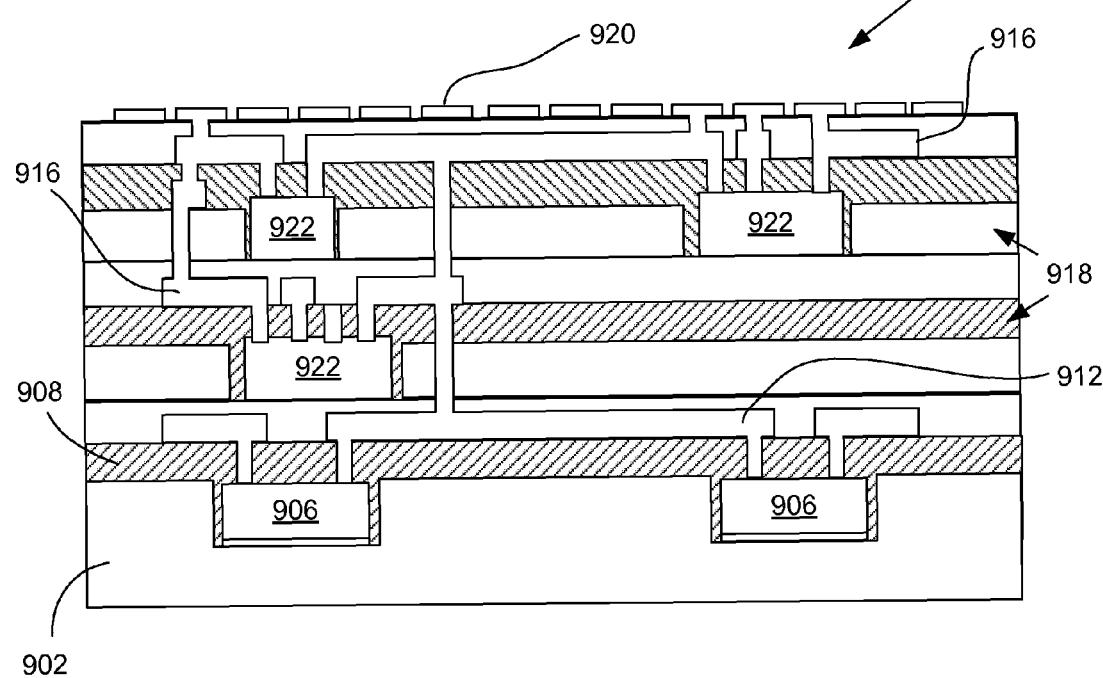

Afterward, additional epoxy layers 918, integrated circuits 922 and/or interconnect layers 916 can be formed over the substrate 902, integrated circuits 906, epoxy layer 908 and interconnect layer 912. These layers and components can be arranged in a wide variety of ways and any of the arrangements and features discussed in connection with FIGS. 1-7C can be used to modify any aspect of the illustrated embodiment. For example, the one or more interconnect layers 912 and/or 916 can be used to electrically connect the integrated circuits 906 positioned within the substrate 902 with any or all of the integrated circuits 922 that are embedded within the epoxy layers 918. Thermal pipes, which can be suitable or unsuitable for transmitting electrical signals, can extend from the substrate-based integrated circuit dice 906 to any exterior surface of the integrated circuit package 921. As described earlier, various passive and active devices, thermal pipes, heat sinks, sensors etc. can be formed or placed in almost any location of the integrated circuit package 921 (e.g., in the substrate 902, on the substrate 902, embedded between epoxy layers 918, etc.) The substrate 902 can also be subjected to backgrinding or any other operation suitable for reducing the thickness of the substrate 902. FIG. 9G illustrates an example of the integrated circuit package of FIG. 9F after additional epoxy layers, interconnect layers and integrated circuits have been applied over the substrate 902, integrated circuits 906, epoxy layer 908 and interconnect layer 912.

Figure 10A:
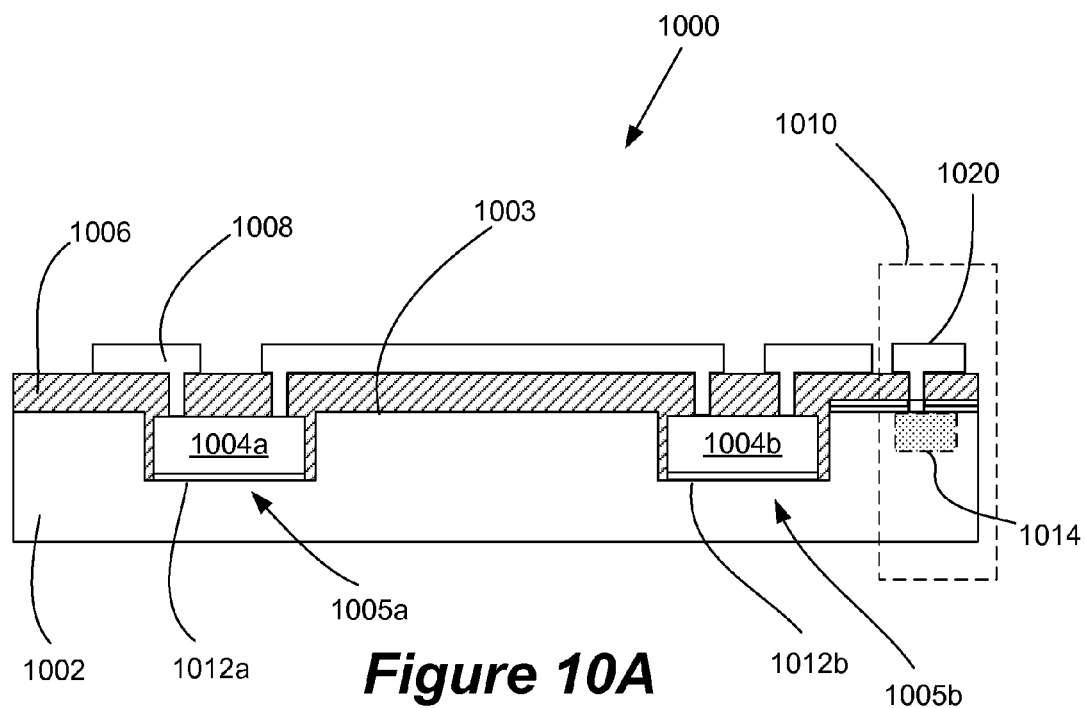
FIGS. 10A-10D illustrate diagrammatic cross-sectional views of package arrangements according to various embodiments of the present invention.

Additional embodiments of the present invention, each of which also include a substrate with one or more embedded integrated circuits, are illustrated in FIGS. 10A-10D. FIG. 10A illustrates integrated circuit package 1000, which includes an electrically and thermally conductive substrate 1002 with embedded integrated circuits 1004, a planarizing, photo-imageable epoxy layer 1006 and an interconnect layer 1008. The integrated circuit package 100 can be formed using any of the techniques described in connection with FIGS. 9A-9F.

Integrated circuit 1004b is mounted onto a bottom surface of cavity 1005 in the substrate 1002 using an electrically conductive adhesive 1012b. As a result, integrated circuit 1004b is electrically coupled with the substrate 1002 and/or can use the substrate 1002 to dissipate heat to an exterior surface of the package. Some implementations also include an integrated circuit 1004a that is electrically insulated from the conductive substrate 1002 by a non-conductive adhesive 1012a. In the illustrated embodiment, only two integrated circuits are shown, but fewer or more integrated circuits that are each electrically coupled or insulated from the substrate 1002 can be positioned within the substrate 1002.

In various embodiments, the substrate 1002 can serve as a conduit for an electrical ground connection. Package 100 includes a ground interconnect 1020, which is formed over and extends through the epoxy layer 1006 and is electrically coupled with a ground contact region 1014 in the substrate 1002. Ground interconnect 1020 is made of an electrically conductive material, such as copper, and may have been formed at least partly during the formation of the interconnect layer 108, as described earlier in connection with FIG. 9F.

Both the ground contact region 1014 in the substrate 1002 and other portions of the substrate 1002 are made of silicon and are doped to improve their electrical conductivity. In order to facilitate an electrical connection between substrate 1002 and the ground interconnect 1020, the ground contact region 1014 has a substantially higher doping concentration than one or more other portions of the substrate 1002. In various implementations the substrate 1002 is made of a p-type semiconductor material and the ground contact region 1014 is a p++ doping region, although the substrate 1002 and the ground contact region 1014 can be doped using any suitable materials and/or concentrations known by persons of ordinary skill in the art. As a result, when the ground interconnect 1020 is electrically grounded, the integrated circuit 1004b, the substrate 1002 and the ground contact region 1004 are electrically coupled with the ground interconnect 1020 and are likewise electrically grounded.

Figure 10B:
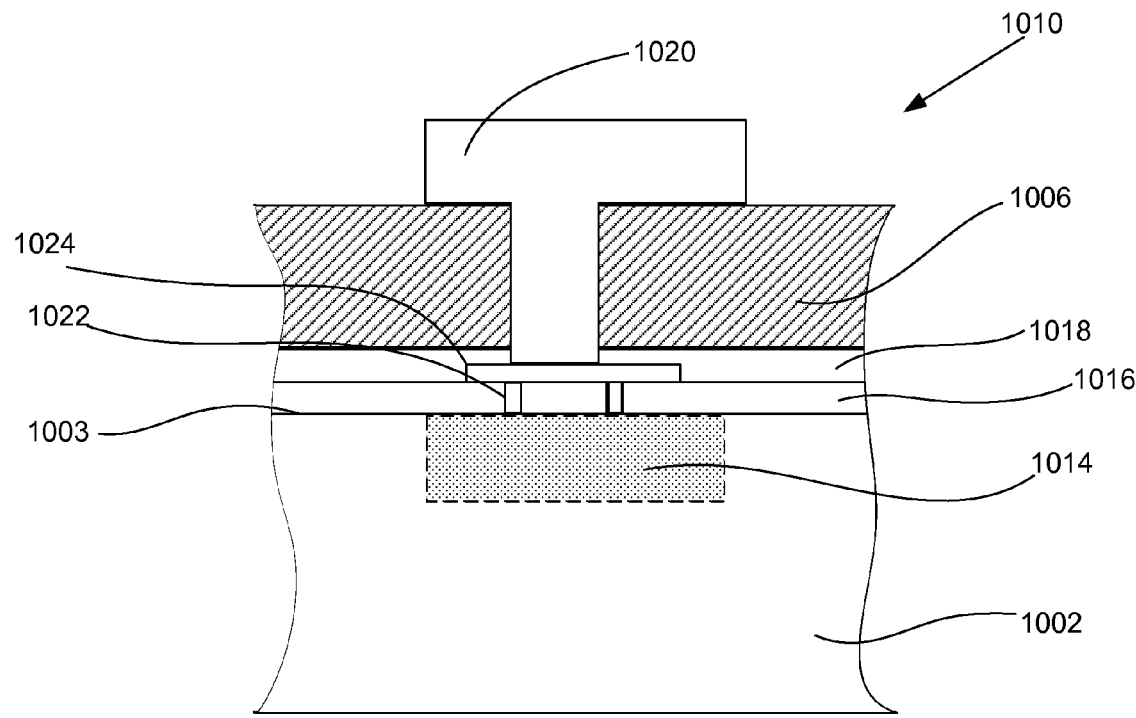

FIG. 10B provides an enlarged view of region 1010 of FIG. 10A according to one embodiment of the present invention. The figure includes substrate 1002 with ground contact region 1014, interlayer dielectric 1016, passivation layer 1018, electrically conductive plugs 1022, electrical interconnects 1024 and 1020, epoxy layer 1006 and ground interconnect 1020. Various techniques known to persons of ordinary skill in the field of semiconductor manufacturing can be used to deposit, pattern and/or develop interlayer dielectric 1016 and pas sivation layer 1018 and form plugs 1022 and electrical interconnect 1024. Plugs 1022 and electrical interconnect 1024 can be made from various suitable electrically conductive materials, including tungsten and aluminum respectively. Epoxy layer 1006 and interconnect 1020 can be formed using various techniques, including those described in connection with FIGS. 9D-9F.

The techniques used to form interlayer dielectric 116 and pas sivation layer 1018 of FIG. 10B can be integrated into the techniques used to form cavities 1005 of FIG. 10A. For example, prior to the formation of cavities 1005, interlayer dielectric 1016 can be deposited across the top surface 1003 of substrate 1002. The interlayer dielectric can be patterned and etched not only to create space for the plugs 1022, but also to form a mask for the formation of cavities 1005 in substrate 1002. Such an approach can help reduce the number of processing steps used to fabricate the integrated circuit package 1000.

Figure 10C:
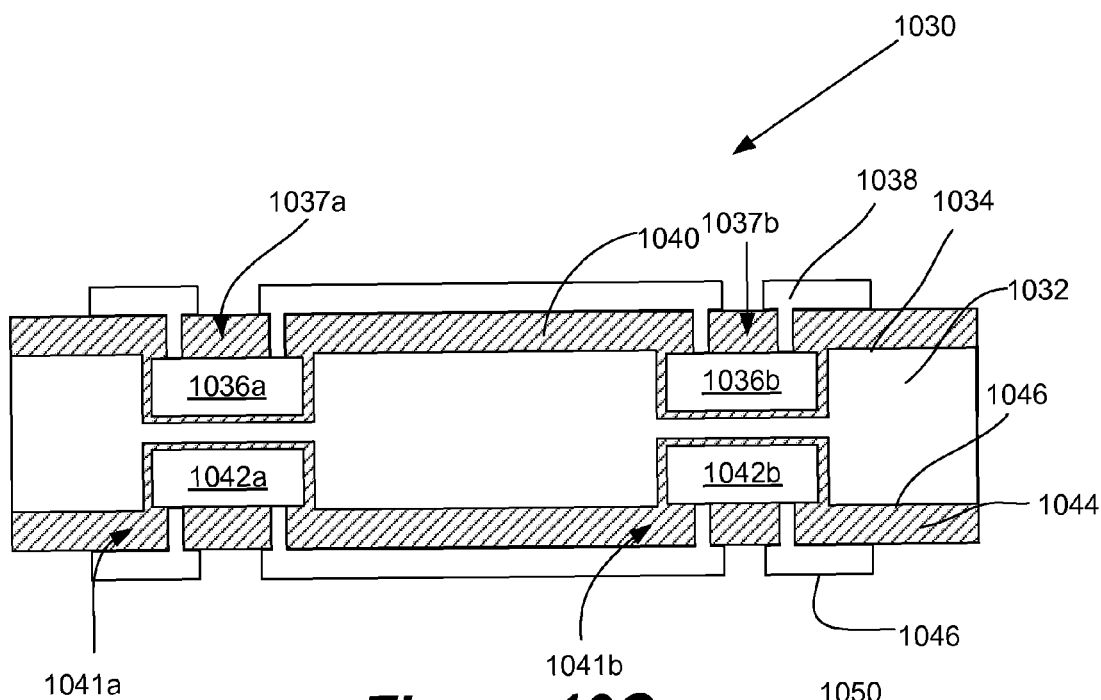

Another embodiment of the present invention is illustrated in FIG. 10C. FIG. 10C includes an integrated circuit package 1030 with integrated circuits, planarizing, photo-imageable epoxy layers and interconnect layers formed on opposing sides of a substrate. In the illustrated embodiment, integrated circuits 1036, epoxy layer 1040 and interconnect layer 1038 are formed over the top surface 1034 of substrate 1032. Integrated circuits 1042, epoxy layer 1044 and interconnect layer 1046 are formed over the opposing bottom surface 1046 of the substrate 1032. One approach to forming the integrated circuit package 1030 is to apply various techniques discussed in connection with FIGS. 9A-9F on both the top and bottom surfaces of the substrate 1032.

A particular implementation of the integrated circuit package 1030 involves arranging integrated circuits to communicate with one another optically through an optically transparent substrate. In the illustrated embodiment, for example, integrated circuits 1036a and 1042a are aligned over one another and include optical devices, such as a laser diode, optical detector, etc. (In still another embodiment, optical devices such as an optical sensor, optical detector, laser diode, etc. may be used in place of integrated circuits 1036a and/or 1042a.) At least the portion of the substrate 1034 between integrated circuits 1036a and 1042a is optically transparent and is arranged to allow optical communication between integrated circuits 1036a and 1042a. The optically transparent substrate can be made of various materials, including glass and quartz. Some implementations involve a substrate 1032 that is entirely made of a single optically transparent material and/or has a uniform composition.

Another approach involves a substrate 1032 made of silicon. The silicon substrate 1032 can electrically insulate the integrated circuits 1036a and 1042a but allow them to communicate optically using, for example, ultraviolet light, which is capable of traveling through silicon.

Figure 10D:
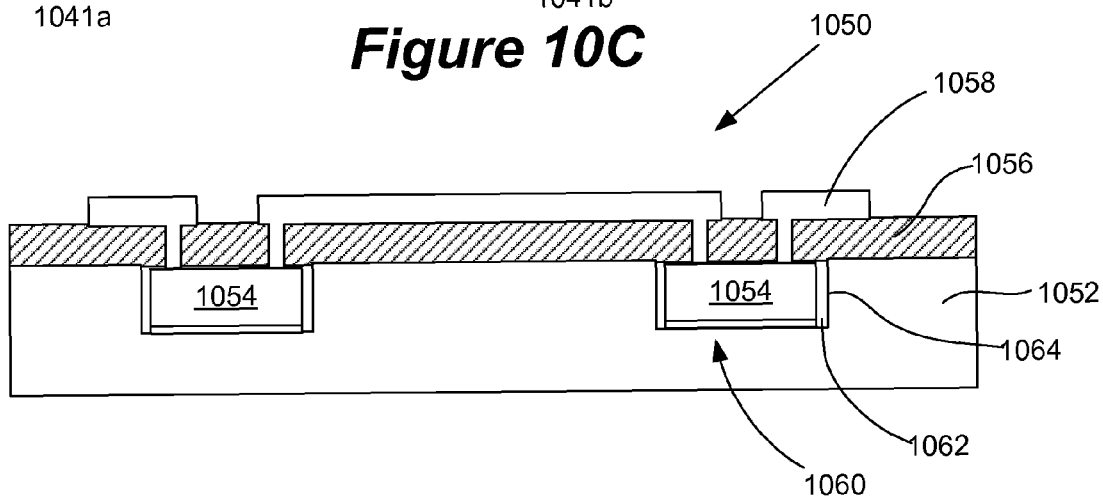

Still another embodiment of the present invention is illustrated in FIG. 10D. FIG. 10D shows an integrated circuit package 1050 with features for reducing stress on one or more integrated circuits 1054 embedded within the package substrate 1052. Integrated circuit package 1050 includes a substrate 1052 with cavities 1060, integrated circuits 1054, photo-imageable epoxy layer 1056 and interconnect layer

1058. Each cavity 1060 includes an air gap 1062 between a sidewall 1064 of the cavity 1060 and the integrated circuit 1054.

During testing and operation, the integrated circuit 1054 and package 1050 can be subjected to temperature cycling. Increases in temperature can cause the integrated circuit 1054 and other components of the package 1050 to expand. If the integrated circuit 1054 is encapsulated in a resilient material, such expansion can impose additional stress upon the integrated circuit 1054. The air gap 1062 can provide room for the integrated circuit 1054 to expand and thus help reduce such stress. Accordingly, epoxy layer 1056 covers but does not extend substantially into the cavity 1060.

Various approaches can be used to form the features of the integrated circuit package 1050. For example, the forming of cavities 1060 in the substrate 1052 and the placement of integrated circuits 1054 in the cavities 1060 can be performed as described earlier in connection with FIGS. 9A-9C. Afterward, a prefabricated sheet of photo-imageable epoxy, such as SU-8, can be applied such that it covers the cavities 1060 and the substrate 1052. In various embodiments, the epoxy layer 1056 is not spray- or spin-coated over the cavities 1060, but is instead laminated onto the substrate 1052. This approach helps to preserve air gaps 1062 between each integrated circuit 1054 and the sidewalls 1064 of the corresponding cavity 1060. The formation of openings in the epoxy layer 1056 and the interconnect layer 1058 can then proceed in a manner similar to the operations described in connection with FIGS. 9E-9F. For example, the epoxy layer 1056 can be patterned using photolithography, which can result in the curing and/or removal of portions of the epoxy layer 1056.

Although only a few embodiments of the invention have been described in detail, it should be appreciated that the invention may be implemented in many other forms without departing from the spirit or scope of the invention. For example, the various embodiments described herein are sometimes illustrated with distinctive and different features. The present invention, however, contemplates a wide variety of integrated circuit packages that can each contain almost any combination of the features described herein and be formed using almost any combination of the processes described herein. To use an example, the substrate 804 of the integrated circuit package 800 of FIG. 8A, which includes one or more embedded integrated circuits 802, can also include metal vias that penetrate through the substrate 804 and electrically connect the interconnect layer 812 with the contacts on the exterior surface of the substrate 804. Such metal vias are described in connection with FIG. 4E. The processes for making the metal vias are described in connection with FIGS. 5A-5H and can be similarly applied to substrate 804 of FIG. 8A. Therefore, the present embodiments should be considered as illustrative and not restrictive and the invention is not limited to the details given herein, but may be modified within the scope and equivalents of the appended claims.

What is claimed is:

1. An integrated circuit package comprising:
   a substrate having a top surface and an opposing bottom surface, there being a first cavity in the substrate, the substrate being formed from one selected from a group consisting of a semiconductor wafer, a semiconductor material, glass, steel, silicon, G10-FR4 and quartz;
   a first integrated circuit positioned within the first cavity;
   a plurality of layers of cured, photo-imageable epoxy that were deposited sequentially, wherein at least some of the epoxy layers are patterned, the plurality of epoxy layers including a first patterned epoxy layer, a second patterned epoxy layer and a third patterned epoxy layer and a fourth epoxy layer, wherein the first patterned epoxy layer is formed on the top surface of the substrate and the active surface of the first integrated circuit, the first patterned epoxy layer having a substantially planar top surface;
   a plurality of interconnect layers, including a first interconnect layer and a second interconnect layer, the first interconnect layer including a plurality of interconnect traces, the first interconnect layer formed on the first patterned epoxy layer and embedded in the first patterned epoxy layer, the first interconnect layer being electrically coupled through a via with the active surface of the first integrated circuit, wherein the second patterned epoxy layer is formed on the first patterned epoxy layer, the second patterned epoxy layer having a substantially planar top surface;
   a second integrated circuit having an active surface, the second integrated circuit being embedded in the second patterned epoxy layer, wherein:
      the third patterned epoxy layer is formed on the second integrated circuit and the second patterned epoxy layer, the third patterned epoxy layer extending over the active surface of the second integrated circuit;
      the second interconnect layer includes a plurality of interconnect traces, the second interconnect layer being electrically coupled through a via with the active surface of the second integrated circuit and embedded in the third patterned epoxy layer;
      the fourth epoxy layer is formed on the second interconnect layer, the second interconnect layer being sandwiched between the third patterned epoxy layer and the fourth epoxy layer;
   a component selected from a group consisting of an I/O pad that is exposed on the exterior of the integrated circuit package, an integrated circuit having an active surface that is covered by one of the epoxy layers and that is positioned in one of the patterned epoxy layers, an integrated circuit having an active surface that is covered by one of the epoxy layers and that is positioned in the substrate, and an electrical device that is embedded in one of the patterned epoxy layers, wherein the second integrated circuit is electrically coupled with the component through one of the interconnect layers; and
   a multiplicity of external package contacts formed over the fourth epoxy layer, the second integrated circuit being electrically connected to one of the external package contacts at least in part through one of the interconnect layers.

2. The integrated circuit package of claim 1 wherein there is an air gap between the sidewalls of the first cavity and the first integrated circuit positioned within the first cavity, thereby giving the first integrated circuit room to expand within the first cavity.

3. The integrated circuit package of claim 1 wherein the substrate includes at least one of a group consisting of: 1) one or more conductive vias that penetrates entirely through the substrate, terminates at an external contact pad on the bottom surface of the substrate and is electrically coupled with the first interconnect layer; 2) a photovoltaic cell; 3) a biosensor; 4) a gas sensor; 5) an acceleration sensor; 6) a vibration sensor; 7) a chemical sensor; 8) an electromagnetic sensor; 9) a temperature sensor; and 10) a humidity sensor.

4. The integrated circuit package of claim 1, wherein the first layer of epoxy is planarizing.

5. The integrated circuit package of claim 1 wherein the substrate is a silicon wafer and the epoxy is SU-8.

6. The integrated circuit package of claim 1, wherein the substrate is made of silicon and has a silicon crystal structure of [1, 1, 0].

7. An integrated circuit package comprising:
- a substrate having a top surface and an opposing bottom surface, there being a first cavity directly in the substrate, the substrate being formed from a semiconductor material, one or more regions of the substrate being doped at a first doping concentration such that the substrate is electrically and thermally conductive, wherein the substrate includes a ground contact region having a second doping concentration substantially greater than the first doping concentration, the ground contact region positioned in an upper region of the substrate that includes the top surface of the substrate;
- a first integrated circuit positioned within the first cavity, the first integrated circuit including a ground contact that is electrically coupled with the one or more doped regions of the substrate;
- a first layer of cured, photo-imageable, patterned epoxy formed on the top surface of the substrate and the active surface of the integrated circuit, the first patterned epoxy layer having a substantially planar top surface;
- a first interconnect layer including a plurality of interconnect traces, the first interconnect layer formed on the first patterned epoxy layer and electrically coupled through a via with the active surface of the first integrated circuit; and
- a ground interconnect formed from an electrically conductive material, the ground interconnect extending entirely through the first patterned epoxy layer and being electrically connected to the ground contact region in the substrate, wherein the ground interconnect, the ground contact region of the substrate, the ground contact on the first integrated circuit and the one or more doped regions of the substrate are arranged to be electrically grounded and electrically coupled to one another.

8. The integrated circuit of claim 7, further comprising:
a second cavity in the substrate; and
a second integrated circuit positioned within the second cavity, the second integrated circuit attached to the substrate via an electrically non-conductive die attach adhesive, thereby electrically isolating the second integrated circuit from the conductive substrate, wherein the first integrated circuit is attached to the substrate via an electrically conductive die attach adhesive, thereby electrically coupling the first integrated circuit with the conductive substrate.

9. An integrated circuit package comprising:
- a substrate having a top surface, an opposing bottom surface and an optically transparent portion, there being a first cavity and a second cavity directly in the substrate, wherein the optically transparent portion is positioned between the first cavity and the second cavity;
- a first integrated circuit positioned within the first cavity, wherein the first integrated circuit includes a first optical device;
- a second integrated circuit positioned in the second cavity, the second integrated circuit positioned opposite the first integrated circuit and including a second optical device arranged to optically communicate with the first optical device in the first integrated circuit through the optically transparent portion of the substrate;
- a first layer of cured, photo-imageable, patterned epoxy formed on the top surface of the substrate and the active surface of the first integrated circuit, the first patterned epoxy layer having a substantially planar top surface;
- a first interconnect layer including a plurality of interconnect traces, the first interconnect layer formed on the first patterned epoxy layer and embedded in the first patterned epoxy layer, the first interconnect layer being electrically coupled through a via with the active surface of the first integrated circuit;
- a second layer of cured, photo-imageable, patterned epoxy formed on the bottom surface of the substrate and the active surface of the second integrated circuit; and
- a second interconnect layer including a plurality of interconnect traces, the second interconnect layer formed on the second patterned epoxy layer and embedded in the second patterned epoxy layer, the second interconnect layer being and electrically coupled through a via with the active surface of the second integrated circuit.

10. The integrated circuit package of claim 9 wherein:
the substrate is made of silicon; and
the first and second optical devices optically communicate via ultraviolet light, thereby facilitating optical communication between the first and second optical devices through the silicon substrate.

* * * * *